(12) United States Patent
Fukasawa

(10) Patent No.: US 9,293,411 B2
(45) Date of Patent: Mar. 22, 2016

(54) SEMICONDUCTOR DEVICE AND MANUFACTURING METHOD OF THE SAME

(71) Applicant: Sony Corporation, Tokyo (JP)

(72) Inventor: Masanaga Fukasawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/494,134

(22) Filed: Sep. 23, 2014

(65) Prior Publication Data

US 2015/0008591 A1 Jan. 8, 2015

Related U.S. Application Data

(63) Continuation of application No. 13/617,806, filed on Sep. 14, 2012, now Pat. No. 8,871,633.

(30) Foreign Application Priority Data

Oct. 4, 2011 (JP) .................................. 2011-219843

(51) Int. Cl.
| | |
|---|---|
| H01L 23/28 | (2006.01) |
| H01L 23/522 | (2006.01) |
| H01L 23/48 | (2006.01) |
| H01L 25/065 | (2006.01) |
| H01L 21/768 | (2006.01) |

(Continued)

(52) U.S. Cl.
CPC ...... *H01L 23/5226* (2013.01); *H01L 21/76898* (2013.01); *H01L 23/481* (2013.01); *H01L 23/528* (2013.01); *H01L 25/0657* (2013.01); *H01L 25/50* (2013.01); *H01L 2225/06541* (2013.01); *H01L 2924/0002* (2013.01)

(58) Field of Classification Search
CPC ............ H01L 21/76898; H01L 23/538; H01L 53/5226
See application file for complete search history.

(56) References Cited

U.S. PATENT DOCUMENTS

| 5,824,579 A | * | 10/1998 | Subramanian et al. ....... 438/238 |
| 2009/0321848 A1 | * | 12/2009 | Ichinose et al. ............... 257/384 |
| 2011/0133339 A1 | * | 6/2011 | Wang ............................ 257/773 |

FOREIGN PATENT DOCUMENTS

| JP | H09-106963 | 4/1997 |
| JP | H11-340322 | 12/1999 |

(Continued)

OTHER PUBLICATIONS

Official Action (no English translation available) for Japanese Patent Application No. 2011-219843 mailed Jul. 14, 2015, 7 pages.

*Primary Examiner* — Reema Patel
(74) *Attorney, Agent, or Firm* — Sheridan Ross P.C.

(57) ABSTRACT

Disclosed herein is a semiconductor device including: a substrate having a first conductive layer and a second conductive layer arranged deeper than the first conductive layer; a large-diameter concave portion having, on a main side of a substrate, an opening sized to overlap the first and second conductive layers, with the first conductive layer exposed in part of the bottom of the large-diameter concave portion; a small-diameter concave portion extended from the large-diameter concave portion and formed by digging into the bottom of the large-diameter concave portion, with the second conductive layer exposed at the bottom of the small-diameter concave portion; and a conductive member provided in a connection hole made up of the large- and small-diameter concave portions to connect the first and second conductive layers.

4 Claims, 15 Drawing Sheets

(51) Int. Cl.
*H01L 25/00* (2006.01)
*H01L 23/528* (2006.01)

(56) References Cited

FOREIGN PATENT DOCUMENTS

| | | |
|---|---|---|
| JP | 2001-210627 | 8/2001 |
| JP | 2003-179132 | 6/2003 |
| JP | 2003-229481 | 8/2003 |
| JP | 2003-332418 | 11/2003 |
| JP | 2004-063859 | 2/2004 |
| JP | 2004-079901 | 3/2004 |
| JP | 2007-134717 | 5/2007 |
| JP | 2008-130615 | 6/2008 |
| JP | 2010-080897 | 4/2010 |
| JP | 2010-153909 | 7/2010 |
| JP | 2010-245506 | 10/2010 |
| JP | 2010-263130 | 11/2010 |
| JP | 2011-159869 | 8/2011 |
| JP | 2011-192744 | 9/2011 |

* cited by examiner

SEMICONDUCTOR DEVICE AND MANUFACTURING METHOD OF THE SAME

CROSS-REFERENCE TO RELATED APPLICATIONS

This application is a continuation of U.S. patent application Ser. No. 13/617,806, filed Sep. 14, 2012, which claims priority to Japanese Patent Application No. JP 2011-219843, filed in the Japan Patent Office on Oct. 4, 2011, the entire disclosures of which are hereby incorporated herein by reference.

BACKGROUND

The present technology relates to a semiconductor device having conductive layers of different heights exposed in a connection hole and a manufacturing method of the same.

LSIs and other semiconductor devices have downsized and grown in sophistication thanks to high-density integration made possible by micro fabrication process. In such a high-density integrated semiconductor device, new ideas have been introduced to reduce the necessary area of the interlayer connection structure for multilayer interconnects. For example, Japanese Patent Laid-Open No. 1997-199586 discloses a semiconductor device having a shared contact structure. In this semiconductor device, the conductive material layers of different heights are connected together with a single connection hole for interlayer connection between multilayer interconnects. As a result, a shared contact structure ensures a smaller necessary area than when a connection hole is provided for each conductive material layer, thus providing high-density integration.

The step of making a connection hole in a shared contact structure is performed as described below. First, a resist pattern having an opening pattern overlapping both of the conductive material layers of different heights is formed by lithography. Next, the interlayer insulating film is etched using the resist pattern as a mask until the shallow conductive material layer is exposed. Next, the surrounding interlayer insulating film is etched using the already-exposed and shallow conductive material layer as a mask until the deep conductive material layer is exposed. The interlayer insulating film is etched as described above using a single resist pattern, thus forming a shared contact structure with different conductive material layers exposed in a connection hole.

SUMMARY

However, the step of making a connection hole in a shared contact structure in related art causes the shallow conductive material layer that is exposed earlier to be subjected to plasma for an extended period of time during etching of the interlayer insulating film, thus resulting in overetching of the shallow conductive material layer. This leads to formation of a metal-based deposit on the side wall of the connection hole. This metal-based deposit remains unremoved after asking or chemical posttreatment, producing particles and resulting in lower yield. Further, this excessive etching of the shallow conductive material layer may give rise to a complete penetration of the conductive material layer. In this case, when the final metal is filled into the connection hole, the metal can come into contact with only the lateral side of the conductive material layer, thus resulting in increased electrical resistance.

In light of the foregoing, it is desirable to provide a semiconductor device having conductive material layers of different heights exposed in a connection hole. The semiconductor device offers improved yield by minimizing excessive etching of the shallow conductive material layer. It is also desirable to provide a manufacturing method of the same.

According to an embodiment of the present technology, there is provided a semiconductor device including a substrate and connection hole. The substrate has a first conductive layer and a second conductive layer arranged deeper than the first conductive layer. The connection hole is made up of a large-diameter concave portion and small-diameter concave portion. The large-diameter concave portion has an opening sized to overlap the first and second conductive layers on a main side of a substrate. The first conductive layer is exposed in part of the bottom of the large-diameter concave portion. The small-diameter concave portion is extended from the large-diameter concave portion and formed by digging into the bottom of the large-diameter concave portion. The second conductive layer is exposed at the bottom of the small-diameter concave portion. A conductive member adapted to connect the first and second conductive layers is provided in the connection hole made up of the large- and small-diameter concave portions.

Further, the present technology is also a manufacturing method of the semiconductor device configured as described above and includes the following steps. A large-diameter resist pattern is formed on a substrate incorporating a first conductive layer and a second conductive layer arranged deeper than the first conductive layer. The large-diameter resist pattern has an opening that exposes the tops of the first and second conductive layers. A large-diameter concave portion having the first conductive layer exposed at the bottom is formed in the substrate based on etching using this large-diameter resist pattern as a mask. A small-diameter resist pattern is formed on the substrate. The small-diameter resist pattern has an opening that exposes the top of the second conductive layer within the area where the large-diameter concave portion is formed. A small-diameter concave portion having the second conductive layer exposed at the bottom is formed in the substrate based on etching using this small-diameter resist pattern as a mask. The semiconductor device configured as described above is acquired by the above steps.

In the semiconductor device configured as described above and the manufacturing method thereof, etching is performed using the large- and small-diameter resist patterns as masks during the formation of the large- and small-diameter concave portions making up the connection hole. As a result, the first and second conductive layers arranged at different depths are exposed in the connection hole. At this time, etching is performed using the unique small-diameter resist pattern covering the first conductive layer as a mask rather than using the first conductive layer exposed at the bottom of the large-diameter concave portion as a mask. This minimizes excessive subjection of the first conductive layer to an etching atmosphere for an extended period of time, thus preventing excessive etching of the same layer.

Thus, the present technology prevents excessive etching of the first conductive layer arranged shallower than the second conductive layer during the formation of the connection hole in which the first and second conductive layers arranged at different depths are exposed. This prevents thinning of the first conductive layer caused by excessive etching, thus providing proper conductivity of the first conductive layer and proper connection between the same layer and filling member. As a result, it is possible to achieve improved yield of the semiconductor device.

DETAILED DESCRIPTION OF THE PREFERRED EMBODIMENTS

Figure 1:
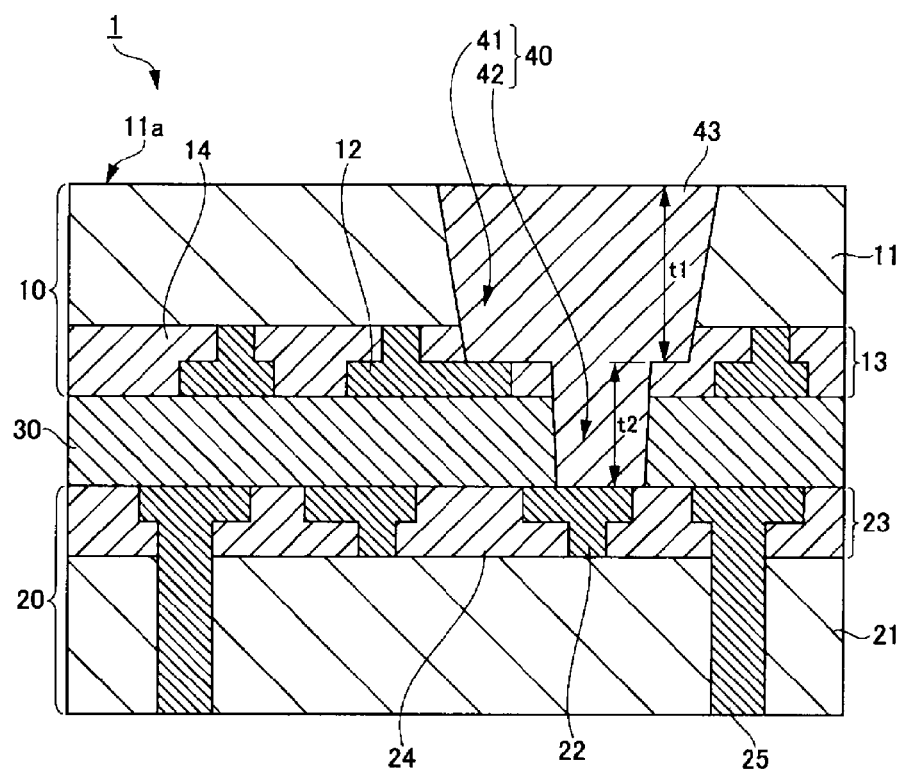
FIG. 1 is a cross-sectional view of main components of a semiconductor device according to a first embodiment.

A description will be given below of the preferred embodiments of the present technology. It should be noted that the description will be given in the following order.
1. First embodiment (configuration of the semiconductor device)
2. First embodiment (manufacturing method in which the first interconnect exposed at the bottom of the large-diameter concave portion formed earlier is covered with the small-diameter resist pattern)
3. Second embodiment (manufacturing method in which etching is stopped halfway in such a manner that the unetched thicknesses on top of the first and second interconnects agree)
4. Third embodiment (manufacturing method in which etching is stopped halfway using the interlayer insulating film as an etching stopper)
5. Fourth embodiment (manufacturing method in which the filling member is filled into the concave portion formed by stopping etching halfway)
6. Fifth embodiment (manufacturing method in which a resist material used to cover the second interconnect is left unremoved in the small-diameter concave portion formed earlier)
7. Sixth embodiment (manufacturing method in which etching is stopped halfway in such a manner that the unetched thicknesses on top of the first and second interconnects agree)
8. Seventh embodiment (manufacturing method in which etching is stopped halfway in such a manner that the unetched thicknesses on top of the first and second interconnects agree and in which a hard mask is used)

It should be noted that like components in the embodiments and modification examples will be denoted by the same reference numerals, and the description thereof will be omitted.

1. First Embodiment

Configuration of the Semiconductor Device

FIG. 1 is a cross-sectional view of main components of a semiconductor device according to a first embodiment. A detailed description will be given below of the semiconductor device according to the first embodiment based on this cross-sectional view of main components.

A semiconductor device 1 shown in FIG. 1 includes a substrate made up of a first substrate 10 and second substrate 20 that are bonded together with a joint section 30. The first substrate 10 incorporates a first interconnect 12, and the second substrate 20 a second interconnect 22. Further, the first interconnect 12 of the first substrate 10 and the second interconnect 22 of the second substrate 20 are connected together via a connection hole 40 that penetrates the first substrate 10. It should be noted that the first and second interconnects are one form of conductive layers. The structure and fabrication method of the connection hole 40 are a distinctive feature of the first embodiment. A detailed description will be given below of the configuration of the semiconductor device 1, with the first substrate 10, second substrate 20 and joint section 30 described in this order.

[First Substrate 10]

The first substrate 10 includes a semiconductor layer 11 and an interconnect layer 13 that is deposited on the side of the second substrate 20.

The semiconductor layer 11 is a thinned semiconductor substrate made, for example, of single crystalline silicon. Transistor sources and drains that are not illustrated here are, for example, provided on the side of the semiconductor layer 11 interfacing with the interconnect layer 13.

Transistor gate electrodes that are not illustrated here are, for example, provided on the side of the interconnect layer 13 interfacing with the semiconductor layer 11. These electrodes are covered with an interlayer insulating film 14 made, for example, of silicon oxide. A plurality of filled interconnects, each made, for example, of copper, are provided in the groove pattern of the interlayer insulating film 14. One of the plurality of filled interconnects is the first interconnect (first conductive layer) 12. Although not illustrated here, on the other hand, some of the filled interconnects are connected to the transistor sources and drains and gate electrodes. It should be noted that the interconnect layer 13 may have a multilayer interconnect structure. In this case, the first interconnect 12 may be provided in a layer of any depth.

[Second Substrate 20]

The second substrate 20 includes a semiconductor layer 21 and an interconnect layer 23 that is deposited on the side of the first substrate 10.

The semiconductor layer 21 is a thinned semiconductor substrate made, for example, of single crystalline silicon. Transistor sources and drains that are not illustrated here are, for example, provided on the side of the semiconductor layer 21 interfacing with the interconnect layer 23.

Transistor gate electrodes that are not illustrated here are, for example, provided on the side of the interconnect layer 23 interfacing with the semiconductor layer 21. These electrodes are covered with an interlayer insulating film 24 made, for example, of silicon oxide. A plurality of filled interconnects, each made, for example, of copper, are provided in the groove pattern of the interlayer insulating film 24. One of the plurality of filled interconnects is the second interconnect (second conductive layer) 22. Although not illustrated here, on the other hand, some of the filled interconnects are connected to the transistor sources and drains and gate electrodes. It should be noted that the interconnect layer 23 may have a multilayer interconnect structure. In this case, the second interconnect 22 may be provided in a layer of any depth.

Further, through-vias 25 penetrating the semiconductor layer 21 are provided in the second substrate 20 and connected to some of the filled interconnects in the interconnect layer 23. The through-vias 25 are made, for example, of copper.

[Joint Section 30]

The joint section 30 is made of an adhesive film bonding the first and second substrates 10 and 20 together. The first and second substrates 10 and 20 are bonded together with the joint section 30 sandwiched between the interconnect layer 13 of the first substrate 10 and the interconnect layer 23 of the second substrate 20.

[Connection Hole 40]

The connection hole 40 is provided to penetrate the first substrate 10 and joint section 30 with the first and second interconnects 12 and 22 exposed at its bottom. The connection hole 40 configured as described above includes a large-diameter concave portion 41 and a small-diameter concave portion 42. The small-diameter concave portion 42 is extended from the large-diameter concave portion 41 and formed by further digging into the bottom of the same portion 41.

The opening of the large-diameter concave portion 41 is provided on the exposed side of the semiconductor layer (hereinafter referred to as a front surface 11a) and sized to overlap the first and second interconnects 12 and 22. That is, it is only necessary for the opening of the large-diameter concave portion 41 to be sized to cover the contact portions of the first and second interconnects 12 and 22 and partially overlap the first and second interconnects 12 and 22 when the substrate is seen in plan view. On the other hand, a depth t1 of the large-diameter concave portion 41 is measured from the front surface 11a to the first interconnect 12. The depth t1 may be a depth overetched to some extent into the first interconnect 12. The interlayer insulating film 14 is exposed together with the first interconnect 12 at the bottom of the large-diameter concave portion 41 located at the depth t1. Further, the opening of the small-diameter concave portion 42 is provided at the bottom thereof. That is, the bottom of the large-diameter concave portion 41 located at the depth t1 includes the first interconnect 12 and interlayer insulating film 14.

On the other hand, the small-diameter concave portion 42 is extended from the large-diameter concave portion 41 and formed by digging into the bottom of the same portion 41. A depth t2 of the small-diameter concave portion 42 is measured from the bottom of the large-diameter concave portion 41 to the second interconnect 22. The second interconnect 22 is exposed at the bottom of the small-diameter concave portion 42. It should be noted that the interlayer insulating film 24 may be exposed together with the second interconnect 22 at the bottom of the small-diameter concave portion 42.

As described above, the bottom of the connection hole 40 located at the depth t1 includes not only the first interconnect 12 but also the interlayer insulating film 14 rather than only the first interconnect 12.

Further, a conductive member 43 is provided in the connection hole 40 to connect the first and second interconnects 12 and 22. That is, the conductive member 43 connects the first and second interconnects 12 and 22 that are exposed at different depths. Among materials that can be used as the conductive member 43 are a filling metal filled into the connection hole 40 and a conductive film provided on the inner wall of the connection hole 40.

Advantageous Effect of the Semiconductor Device According to the First Embodiment The semiconductor device 1 according to the first embodiment described above has the interlayer insulating film 14 exposed together with the first interconnect 12 at the bottom located at the depth t1 of the connection hole 40. That is, the small-diameter concave portion 42 making up the connection hole 40 is formed by etching using a unique pattern as a mask rather than using the first interconnect 12 exposed at the bottom of the large-diameter concave portion 41 as a mask.

As will be described in detail thereafter in the embodiments of the manufacturing method, therefore, the semiconductor device 1 includes the connection hole 40 adapted to prevent excessive etching of the first interconnect 12 that is exposed at the depth t1, thus preventing defects caused by this excessive etching and providing improved yield.

2. First Embodiment

Manufacturing Method in which the First Interconnect Exposed at the Bottom of the Large-Diameter Concave Portion Formed Earlier is Covered with the Small-Diameter Resist Pattern A description will be given below of the manufacturing method of the semiconductor device 1 according to the first embodiment described above with reference to the cross-sectional process diagrams shown in FIGS. 2A to 2G.

Figure 2A:
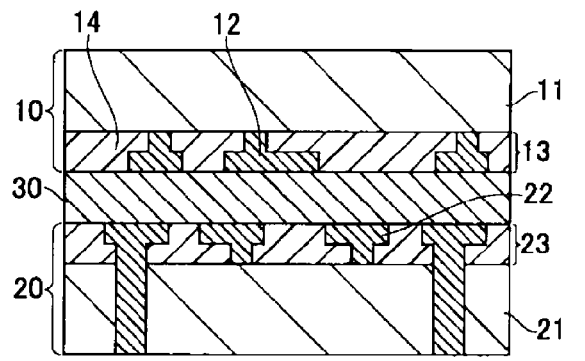
FIGS. 2A to 2G are cross-sectional process diagrams illustrating the manufacturing method of the semiconductor device according to the first embodiment.

As illustrated in FIG. 2A, the first and second substrates 10 and 20 are fabricated. The interconnect layer 13 including the first interconnect 12 is provided on one of the main sides of the semiconductor layer 11 of the first substrate 10. The interconnect layer 23 including the second interconnect 22 is provided on one of the main sides of the semiconductor layer 21 of the second substrate 20. The first and second substrates 10 and 20 are bonded together with the joint section 30 sandwiched between the interconnect layer 13 and interconnect layer 23, thus fabricating a bonded substrate.

It should be noted that the steps up to this point are not particularly limited and may be performed using ordinary techniques. The steps of forming a connection hole from this point onward are a distinctive feature of the first embodiment.

Figure 2B:
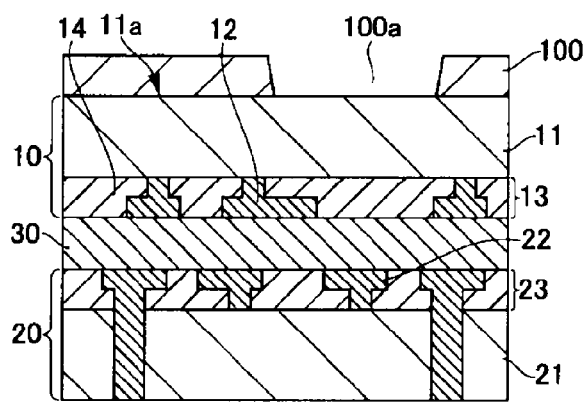

As illustrated in FIG. 2B, a large-diameter resist pattern 100 is formed on the exposed side of the semiconductor layer 11 (front side 11a) of the fabricated bonded substrate. The large-diameter resist pattern 100 has an opening 100a that exposes the tops of the first and second interconnects 12 and 22. That is, the opening 100a is formed where the contact portions of the first and second interconnects 12 and 22 are covered when the semiconductor layer 11 is seen in plan view from the side of the front side 11a.

Figure 2C:
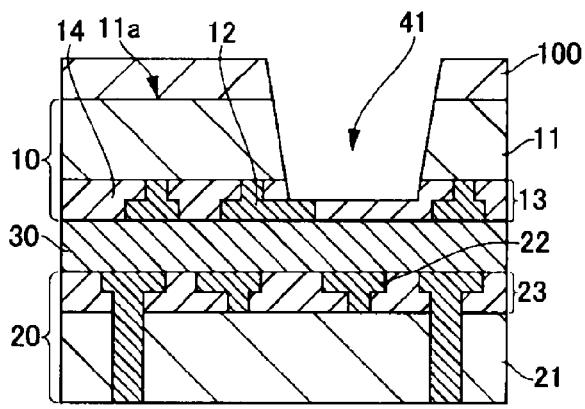

As illustrated in FIG. 2C, the large-diameter concave portion 41 is formed in the bonded substrate by etching using the large-diameter resist pattern 100 as a mask. At this time, the semiconductor layer 11 is etched using the large-diameter resist pattern 100 as a mask, followed by etching of the interlayer insulating film 14 until the first interconnect 12 is exposed. The etching is terminated when the first interconnect 12 is detected. Here, etching is performed using $CF_4/Ar$ or $CF_4/Ar/O_2$ as an etching gas. However, the etching gas is not limited thereto. After the etching, the large-diameter resist pattern 100 is removed.

As a result of the above, the large-diameter concave portion 41 is formed which has an opening sized to overlap the first and second interconnects 12 and 22, with the first interconnect 12 exposed in part of the bottom.

Figure 2D:
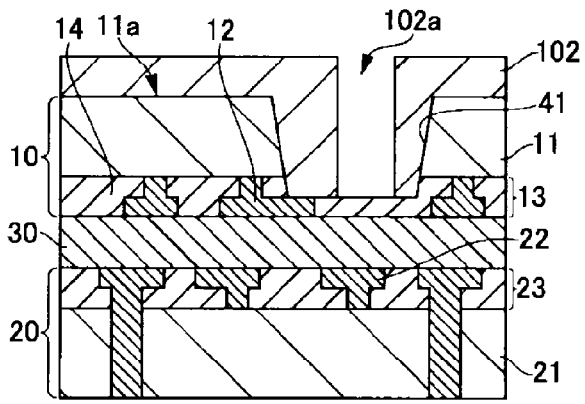

As illustrated in FIG. 2D, a new small-diameter resist pattern 102 is formed on the front side 11a of the semiconductor layer 11. The small-diameter resist pattern 102 has an opening 102a that does not overlap the first interconnect 12 but exposes the top of the second interconnect 22 within the area where the large-diameter concave portion 41 is formed in the bonded substrate. That is, the small-diameter resist pattern 102 fully covers the first interconnect 12 that is exposed at the bottom of the large-diameter concave portion 41. On the other hand, the opening 102a formed in the small-diameter resist pattern 102 exposes the interlayer insulating film 14 located above the second interconnect 22.

Figure 2E:
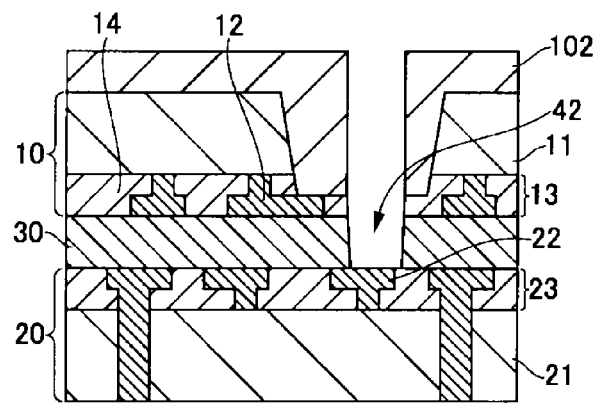

As illustrated in FIG. 2E, the small-diameter concave portion 42 is formed at the bottom of the large-diameter concave portion 41 by etching using the small-diameter resist pattern 102 as a mask. At this time, the interlayer insulating film 14 is etched by using the small-diameter resist pattern 102 covering the first interconnect 12 as a mask, followed by etching of the joint section 30. The etching is terminated when the second interconnect 22 is detected. Here, etching is performed using $CF_4/Ar$ or $CF_4/Ar/O_2$ as an etching gas. However, the etching gas is not limited thereto.

As a result of the above, the small-diameter concave portion 42 is formed which is extended from the large-diameter concave portion 41 and formed by digging into the bottom of the large-diameter concave portion 42. The second interconnect 22 is exposed at the bottom of the small-diameter concave portion 42.

Figure 2F:
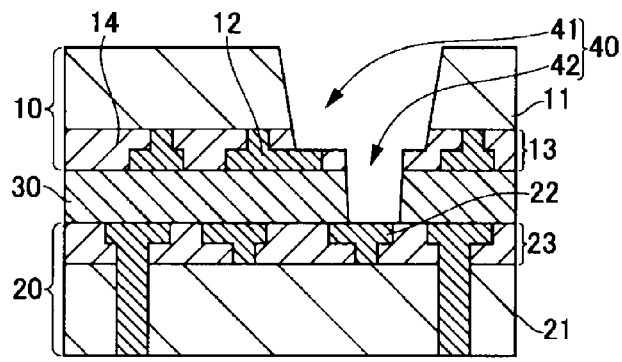

As illustrated in FIG. 2F, the resist pattern (102) is removed. This completes the fabrication of the connection hole 40 having the first and second interconnects 12 and 22 exposed at its bottom.

Figure 2G:
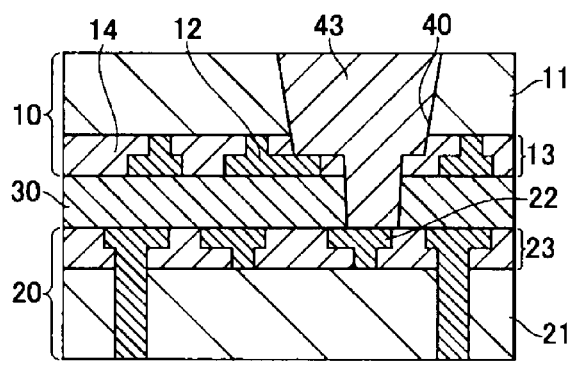

As illustrated in FIG. 2G, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40. As a result, the semiconductor device 1 according to the first embodiment described with reference to FIG. 1 is acquired.

Advantageous Effect of the Manufacturing Method of the Semiconductor Device According to the First Embodiment In the manufacturing method according to the first embodiment described above, etching is performed using the large-diameter resist pattern 100 and small-diameter resist pattern 102 as masks respectively to form the patterns of the large-diameter concave portion 41 and small-diameter concave portion 42. When the pattern of the small-diameter concave portion 42 is formed, etching is performed using the unique small-diameter resist pattern 102 covering the first interconnect 12 as a mask rather than using the first interconnect 12 exposed at the bottom of the large-diameter concave portion 41 as a mask. This prevents excessive subjection of the first interconnect 12 to an etching atmosphere.

Therefore, the manufacturing method according to the first embodiment prevents accumulation of reaction products produced by excessive etching of the first interconnect 12 on the side wall of the connection hole 40. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Further, etching is performed using two resist patterns, one for the large-diameter concave portion 41 and another for the small-diameter concave portion 42. Therefore, a thinner resist film is enough, which is not the case for etching using a single resist pattern all the way through the process. This provides improved patterning accuracy of the resist pattern used to form the connection hole 40, thus contributing to pitch reduction in the semiconductor device.

3. Second Embodiment

Manufacturing Method in which Etching is Stopped Halfway in Such a Manner that the Unetched Thicknesses on Top of the First and Second Interconnects Agree A description will be given below of the manufacturing method of the semiconductor device 1 according to a second embodiment with reference to the cross-sectional process diagrams shown in FIGS. 3A to 3G. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween. The steps of forming the connection hole 40 thereafter are a distinctive feature of the second embodiment.

Figure 3A:
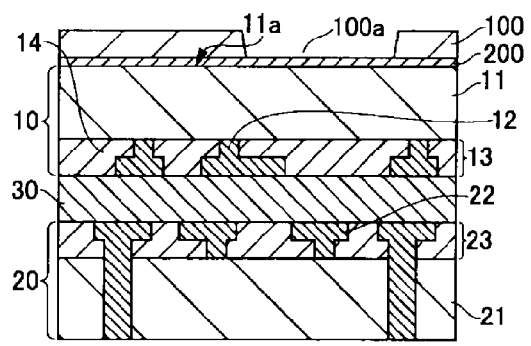
FIGS. 3A to 3G are cross-sectional process diagrams illustrating the manufacturing method of the semiconductor device according to a second embodiment.

Next, as illustrated in FIG. 3A, a hard mask layer 200 is formed on the front side 11a of the semiconductor layer 11 of the fabricated bonded substrate. The hard mask layer 200 is made of a material such as titanium nitride (TiN) to which particles caused by etching do not readily adhere. Further, the large-diameter resist pattern 100 having the opening 100a is formed on the hard mask layer 200. The opening 100a exposes the tops of the first and second interconnects 12 and 22.

Figure 3B:
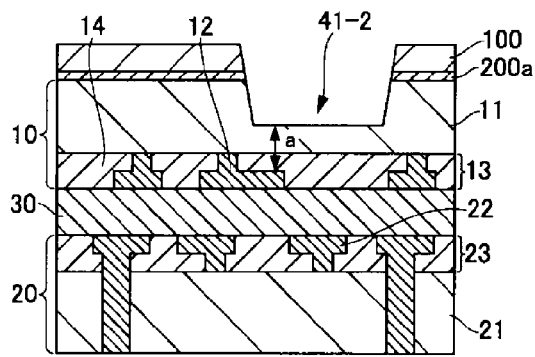

As illustrated in FIG. 3B, the hard mask layer 200 is etched using the large-diameter resist pattern 100 as a mask, thus forming a hard mask 200a. Next, the semiconductor layer 11 is etched using the large-diameter resist pattern 100 as a mask, thus forming the pattern of a large-diameter concave portion 41-2 on the bonded substrate. At this time, the etching of the semiconductor layer 11 is terminated before the first interconnect 12 is reached, thus leaving the semiconductor layer 11 and interlayer insulating film 14 unremoved on top of the first interconnect 12. Here, for example, the hard mask layer 200 made of titanium nitride (TiN) is etched using $Cl_2/BCl_3$ as an etching gas, and the semiconductor layer 11 made of silicon (Si) is etched using $Cl_2/O_2$ as an etching gas. After the etching, the large-diameter resist pattern 100 is removed.

As a result of the above, the large-diameter concave portion 41-2 is formed which has an opening sized to overlap the first and second interconnects 12 and 22, with an unetched thickness 'a' remaining unremoved on top of the first interconnect 12.

Figure 3C:
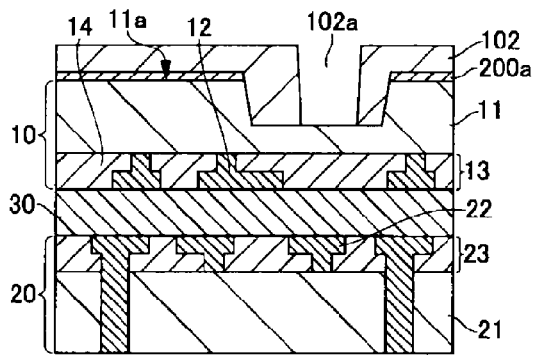

As illustrated in FIG. 3C, the small-diameter resist pattern 102 is formed anew on the hard mask 200a. The small-diameter resist pattern 102 has the opening 102a that does not overlap the first interconnect 12 but exposes the top of the second interconnect 22 within the area where the large-diameter concave portion 41-2 is formed in the bonded substrate.

Figure 3D:
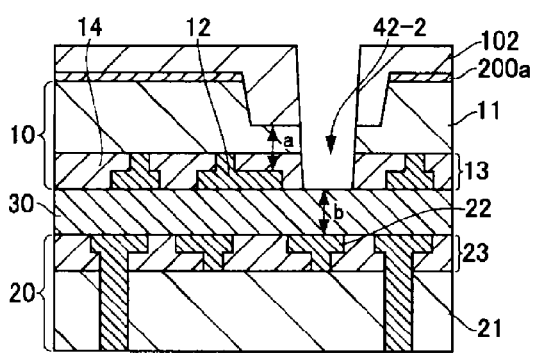

As illustrated in FIG. 3D, the pattern of a small-diameter concave portion 42-2 is formed at the bottom of the large-diameter concave portion 41-2 by etching using the small-diameter resist pattern 102 as a mask. At this time, the semiconductor layer 11, interlayer insulating film 14 and joint section 30 are etched in this order using the small-diameter resist pattern 102 as a mask, and the etching is terminated before the second interconnect 22 is reached. Here, etching is performed until the unetched thickness 'a' on top of the first interconnect 12 and an unetched thickness 'b' on top of the second interconnect 22 agree (i.e., a=b). For example, an etching time that provides a=b is specified in advance, and the etching is terminated when this period of time elapses.

Figure 3E:
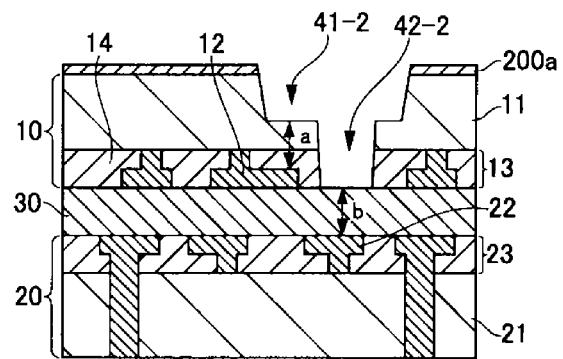

As illustrated in FIG. 3E, the resist pattern (102) is removed. As a result, the hard mask 200a is provided on the front side 11a of the semiconductor layer 11. The same mask 200 has the large-diameter concave portion 41-2 whose depth does not expose the first interconnect 12 and the small-diameter concave portion 42-2 whose depth does not expose the second interconnect 22 and is aligned with the opening of the large-diameter concave portion 41-2. In this condition, the unetched thickness 'a' on top of the first interconnect 12 and the unetched thickness 'b' on top of the second interconnect 22 agree (i.e., a=b).

Figure 3F:
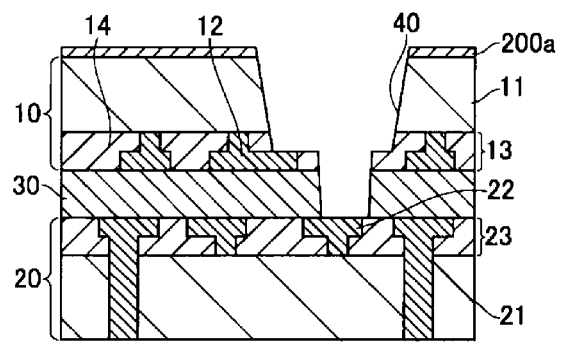

As illustrated in FIG. 3F, the bottoms of the large- and small-diameter concave portions 41-2 and 42-2 are dug at the same time by etching from above the hard mask 200a. At this time, the semiconductor layer 11, interlayer insulating film 14 and joint section 30 are etched until both of the first and second interconnects 12 and 22 are exposed. Here, etching is performed under the conditions that allow digging of the semiconductor layer 11, interlayer insulating film 14 and joint section 30 at the same etch rate. For example, etching is performed using $CF_4/Ar$ or $CF_4/Ar/O_2$ as an etching gas. After the etching, the hard mask 200a is removed as necessary. This completes the fabrication of the connection hole 40 having the first and second interconnects 12 and 22 exposed at its bottom.

Figure 3G:
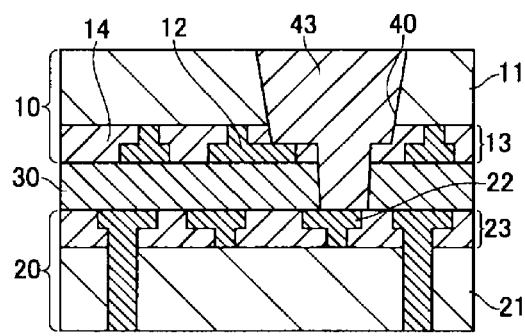

As illustrated in FIG. 3G, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the second embodiment is complete.

Advantageous Effect of the Manufacturing Method of the Semiconductor Device According to the Second Embodiment In the manufacturing method according to the second embodiment described above, the large- and small diameter concave portions 41-2 and 42-2 are formed first in such a manner that the small diameter concave portion 42-2 is extended from the bottom of the large-diameter concave portion 41-2 without exposing the first and second interconnects 12 and 22 as illustrated in FIG. 3E. At this time, etching is performed so that the unetched thickness 'a' on top of the first interconnect 12 and the unetched thickness 'b' on top of the second interconnect 22 agree (i.e., a=b). In this condition, the semiconductor layer 11, interlayer insulating film 14 and joint section 30 are etched at the same etch rate. As a result, the etching is terminated when the second interconnect 22 is exposed simultaneously with the exposure of the first interconnect 12. This ensures that the exposed first interconnect 12 is not subjected to an etching atmosphere for an extended period of time.

Therefore, the manufacturing method according to the second embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Still further, in the manufacturing method according to the second embodiment, the depth of the large-diameter concave portion 41-2 that does not reach the first interconnect 12 is smaller than the depth t1 of the large-diameter concave portion 41 having the first interconnect 12 exposed at the bottom described with reference to FIG. 1 as illustrated in FIG. 3B.

This particularly contributes to an even thinner resist film of the large-diameter resist pattern 100 used to form the pattern of the shallow large-diameter concave portion 41-2, thus providing improved patterning accuracy in fabricating the large-diameter resist pattern 100.

In addition, as illustrated in FIG. 3C, during the formation of the small-diameter resist pattern 102 on the front side 11a of the semiconductor layer 11 on which the shallow large-diameter concave portion 41-2 is formed, the resist film with only a small level difference is patterned by photolithography, thus ensuring high patterning accuracy.

This contributes to further pitch reduction in the semiconductor device.

4. Third Embodiment

Manufacturing Method in which Etching is Stopped Halfway Using the Interlayer Insulating Film as an Etching Stopper A description will be given below of the manufacturing method of the semiconductor device 1 according to a third embodiment with reference to the cross-sectional process diagrams shown in FIGS. 4A to 4G. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween.

Figure 4A:
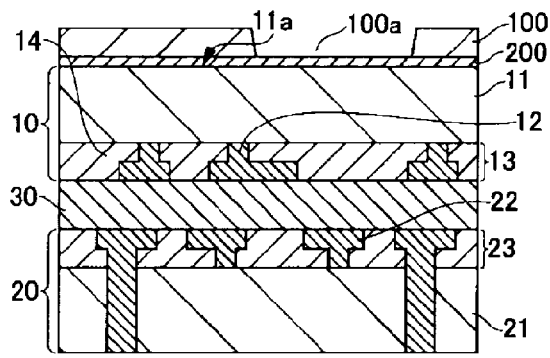
FIGS. 4A to 4G are cross-sectional process diagrams illustrating the manufacturing method of the semiconductor device according to a third embodiment.

Next, as illustrated in FIG. 4A, the hard mask layer 200 is formed on the front side 11a of the semiconductor layer 11 of the fabricated bonded substrate. Further, the large-diameter resist pattern 100 is formed on the hard mask layer 200. The same pattern 100 has the opening 100a that exposes the tops of the first and second interconnects 12 and 22. The steps up to this point are the same as those of the manufacturing method according to the second embodiment. The timing described next when etching is terminated during the formation of the pattern of the large-diameter concave portion is a distinctive feature of the third embodiment.

Figure 4B:
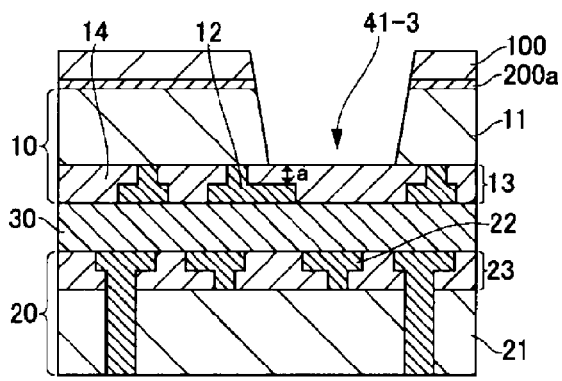

As illustrated in FIG. 4B, the hard mask layer 200 is etched using the large-diameter resist pattern 100 as a mask, thus forming the hard mask 200a. Next, the semiconductor layer 11 is etched under different etching conditions using the large-diameter resist pattern 100 as a mask, thus forming the pattern of a large-diameter concave portion 41-3 on the bonded substrate. At this time, the interlayer insulating film 14 is used as an etching stopper, and the etching is terminated when the same film 14 is exposed. This leaves the interlayer insulating film 14 unremoved as the unetched thickness 'a' on top of the first interconnect 12. After the etching, the large-diameter resist pattern 100 is removed.

As a result, the large-diameter concave portion 41-3 is formed which has an opening sized to overlap the first and second interconnects 12 and 22 with its bottom located at the interface between the semiconductor layer 11 and interlayer insulating film 14.

Figure 4C:
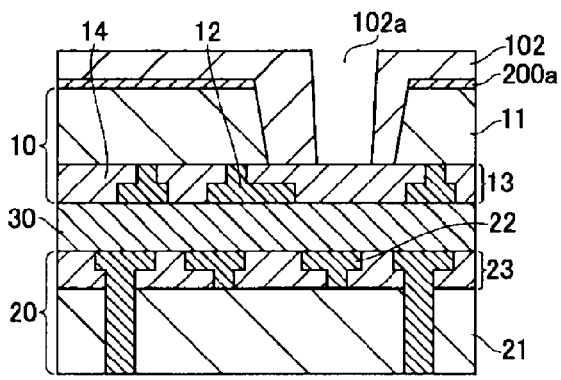

As illustrated in FIG. 4C, the small-diameter resist pattern 102 is formed anew on the hard mask 200a. The small-diameter resist pattern 102 has the opening 102a that does not overlap the first interconnect 12 but exposes the top of the second interconnect 22 within the area where the large-diameter concave portion 41-3 is formed in the bonded substrate.

Figure 4D:
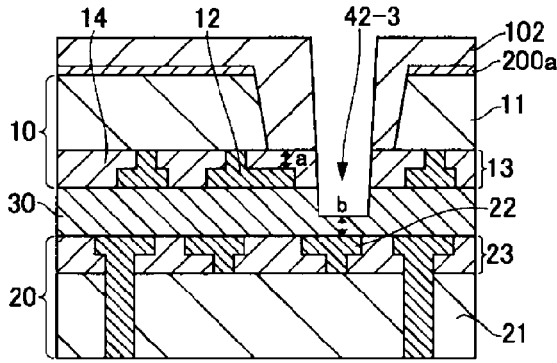

As illustrated in FIG. 4D, the pattern of a small-diameter concave portion 42-3 is formed at the bottom of the large-diameter concave portion 41-3 by etching using the small-diameter resist pattern 102 as a mask. At this time, the interlayer insulating film 14 and joint section 30 are etched in this order using the small-diameter resist pattern 102 as a mask, and the etching is terminated before the second interconnect 22 is reached. Here, etching is performed until the unetched thickness 'a' on top of the first interconnect 12 and the unetched thickness 'b' on top of the second interconnect 22 agree (i.e., a=b) as in the second embodiment.

Figure 4E:
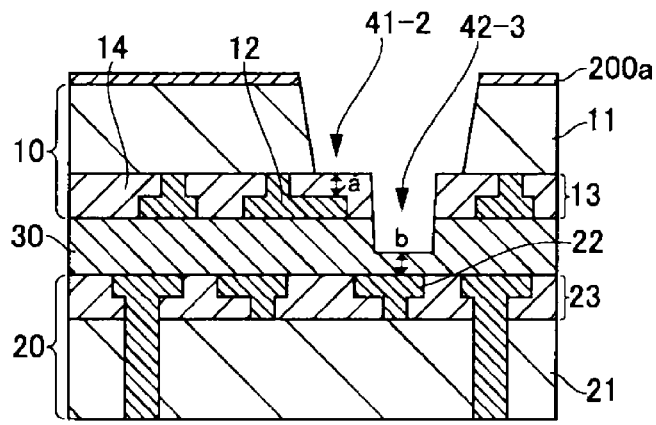

As illustrated in FIG. 4E, the resist pattern (102) is removed. As a result, the hard mask 200a is provided which has the large-diameter concave portion 41-3 whose depth does not expose the first interconnect 12 and the small-diameter concave portion 42-3 whose depth does not expose the second interconnect 22 and which is aligned with the opening of the large-diameter concave portion 41-3 on the front side 11a of the semiconductor layer 11. In this condition, the unetched thickness 'a' on top of the first interconnect 12 and the unetched thickness 'b' on top of the second interconnect 22 agree (i.e., a=b).

Figure 4F:
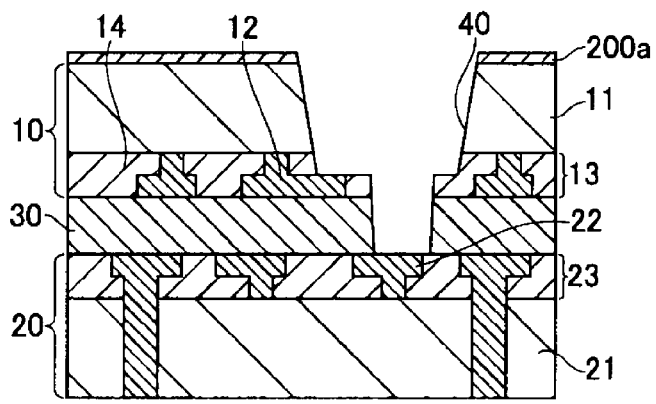

As illustrated in FIG. 4F, the bottoms of the large- and small-diameter concave portions 41-3 and 42-3 are dug at the same time by etching from above the hard mask 200a. At this time, the interlayer insulating film 14 and joint section 30 are etched until both of the first and second interconnects 12 and 22 are exposed. Here, etching is performed under the conditions that allow digging of the interlayer insulating film 14 and joint section 30 at the same etch rate. After the etching, the hard mask 200a is removed as necessary.

This completes the fabrication of the connection hole 40 having the first and second interconnects 12 and 22 exposed at its bottom.

Figure 4G:
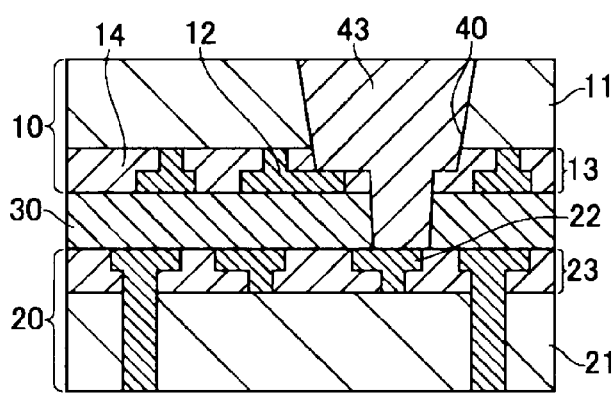

As illustrated in FIG. 4G, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the third embodiment is complete.

Advantageous Effect of the Manufacturing Method of the Semiconductor Device According to the Third Embodiment In the manufacturing method according to the third embodiment described above, the large- and small diameter concave portions 41-3 and 42-3 are formed first in such a manner that the small diameter concave portion 42-3 is extended from the bottom of the large-diameter concave portion 41-3 without exposing the first and second interconnects 12 and 22 as illustrated in FIG. 4E. At this time, etching is performed so that the unetched thickness 'a' on top of the first interconnect 12 and the unetched thickness 'b' on top of the second interconnect 22 agree (i.e., a=b). In this condition, the semiconductor layer 11, interlayer insulating film 14 and joint section 30 are etched at the same etch rate. As a result, the etching is terminated when the second interconnect 22 is exposed simultaneously with the exposure of the first interconnect 12. This ensures that the exposed first interconnect 12 is not subjected to an etching atmosphere for an extended period of time.

Therefore, the manufacturing method according to the third embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

Further, in the manufacturing method according to the third embodiment, the interlayer insulating film 14 is used as an etching stopper during the formation of a pattern of the large-diameter concave portion 41-3, and the etching is terminated when the same film 14 is exposed as illustrated in FIG. 4B. This makes it possible to terminate etching in a well-controlled manner, thus contributing to improved yield of the semiconductor device 1.

Still further, the depth of the large-diameter concave portion 41-3 that does not reach the first interconnect 12 is smaller than the depth t1 of the large-diameter concave portion 41 having the first interconnect 12 exposed at the bottom described with reference to FIG. 1. This provides improved patterning accuracy in forming the large- and small-diameter resist patterns 100 and 102 as in the second embodiment.

As a result, it is possible to achieve further pitch reduction in the semiconductor device.

5. Fourth Embodiment

Manufacturing Method in which the Filling Member is Filled into the Concave Portion Formed by Stopping Etching Halfway)>

A description will be given below of the manufacturing method of the semiconductor device 1 according to a fourth embodiment with reference to the cross-sectional process diagrams shown in FIGS. 5A to 5H. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween.

Figure 5A:
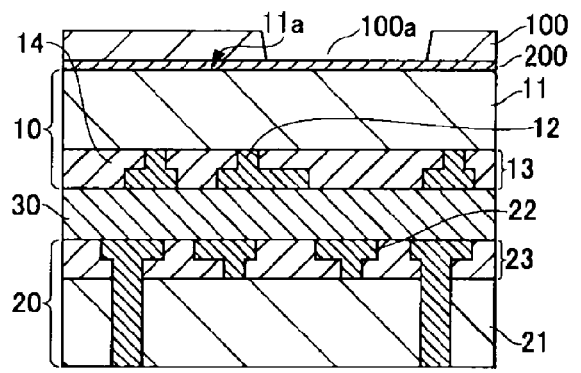
FIGS. 5A to 5H are cross-sectional process diagrams illustrating the manufacturing method of the semiconductor device according to a fourth embodiment.

Next, as illustrated in FIG. 5A, the hard mask layer 200 is formed on the front side 11a of the semiconductor layer 11 of the fabricated bonded substrate. A material which will serve as an etching mask for the filling material formed thereafter is used as the hard mask layer 200. Among materials that can be used as the hard mask layer 200 are titanium nitride (TiN) and silicon nitride (SiN). Here, silicon nitride (SiN) is used as an example. Next, the large-diameter resist pattern 100 is formed on the hard mask layer 200. The same pattern 100 has the opening 100a that exposes the tops of the first and second interconnects 12 and 22.

Figure 5B:
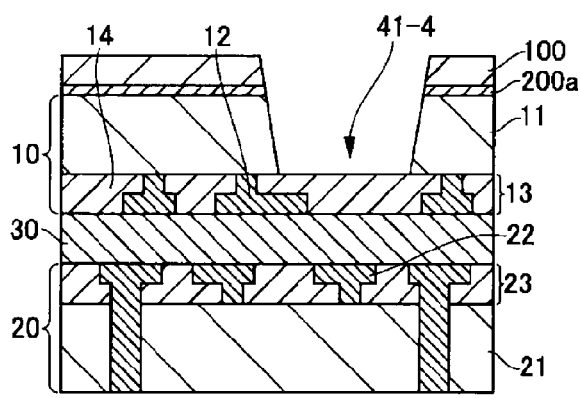

As illustrated in FIG. 5B, the hard mask layer 200 is etched using the large-diameter resist pattern 100 as a mask, thus forming the hard mask 200a. Next, the semiconductor layer 11 is etched using the large-diameter resist pattern 100 as a mask, thus forming the pattern of a large-diameter concave portion 41-4 on the bonded substrate. At this time, the etching is terminated before the first interconnect 12 is exposed, thus leaving the semiconductor layer 11 and interlayer insulating film 14 unremoved on top of the first interconnect 12. Although only the interlayer insulating film 14 is left unremoved in the example shown in FIG. 5B, the semiconductor layer 11 may be left unremoved together with the interlayer insulating film 14. Here, etching is performed using $Cl_2/O_2$ as an etching gas. After the etching, the large-diameter resist pattern 100 is removed.

As a result, the large-diameter concave portion 41-4 is formed which has an opening sized to overlap the first and second interconnects 12 and 22 with its bottom located at the interface between the semiconductor layer 11 and interlayer insulating film 14.

The steps up to this point are the same as those of the manufacturing method according to the third embodiment. The step of filling the large-diameter concave portion 41-4 described next is a distinctive feature of the fourth embodiment.

Figure 5C:
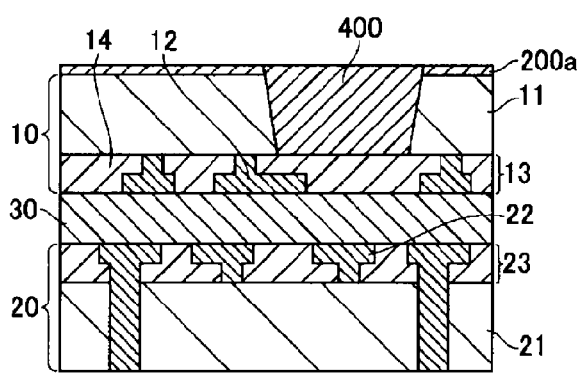

As illustrated in FIG. 5C, a filling member 400 is filled into the large-diameter concave portion 41-4 for planarization. The filling member 400 has a high etch selectivity against the hard mask 200a in the etching step which will be performed next. Silicon oxide ($SiO_2$) is among such a material.

Figure 5D:
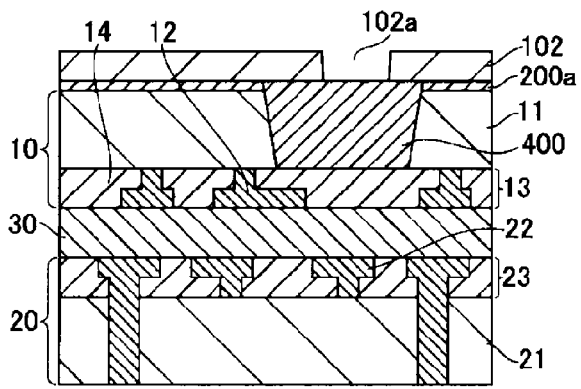

As illustrated in FIG. 5D, the new small-diameter resist pattern 102 is formed on the hard mask 200a. The small-diameter resist pattern 102 has the opening 102a that does not overlap the first interconnect 12 but exposes the top of the second interconnect 22 within the area where the large-diameter concave portion 41-4 is formed in the bonded substrate.

Figure 5E:
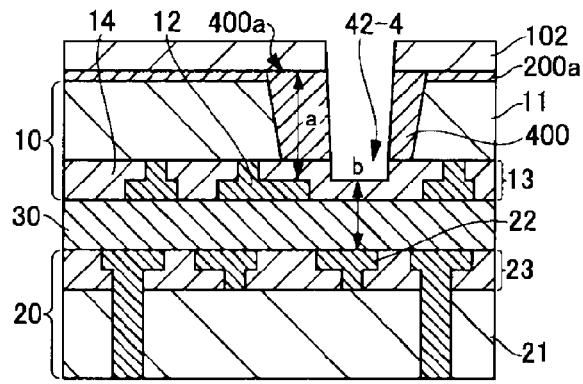

As illustrated in FIG. 5E, the pattern of a small-diameter concave portion 42-4 is formed in the substrate having the filling member 400 filled therein by etching using the small-diameter resist pattern 102 as a mask. At this time, the filling member 400 is etched using the small-diameter resist pattern 102 as a mask, and the etching is terminated before the second interconnect 22 is reached. Here, etching is performed until the unetched thickness 'a' on top of the first interconnect 12 and the unetched thickness 'b' on top of the second interconnect 22 agree (i.e., a=b). Therefore, the interlayer insulating film 14 is etched as necessary.

Figure 5F:
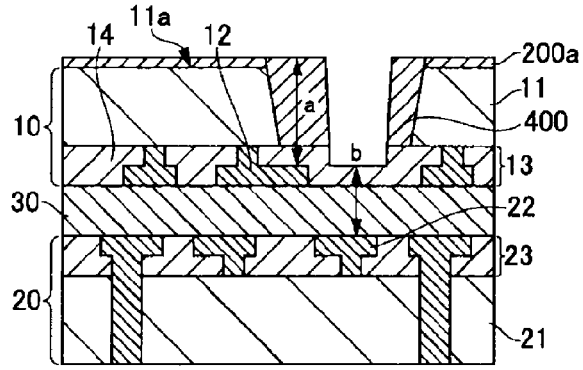

As illustrated in FIG. 5F, the resist pattern (102) is removed. As a result, the filling member 400 is provided in the large-diameter concave portion 41-4, the small-diameter concave portion 42-4 is provided in the filling member 400, and the hard mask 200a is provided on the front side 11a of the semiconductor layer 11. The same mask 200 is aligned with the opening of the large-diameter concave portion 41-4. In this condition, the unetched thickness 'a' on top of the first interconnect 12 and the unetched thickness 'b' on top of the second interconnect 22 agree (i.e., a=b).

Figure 5G:
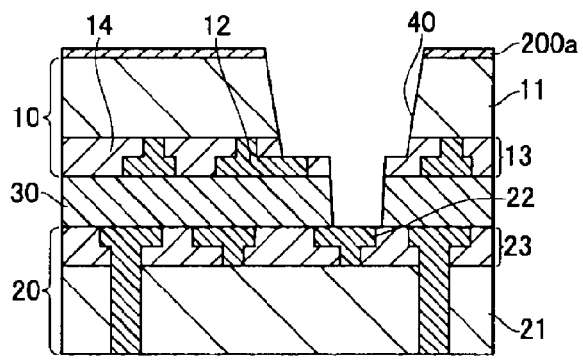

As illustrated in FIG. 5G, the bottoms of the filling member 400 and small-diameter concave portion 42-4 are dug at the same time by etching from above the hard mask 200a. At this time, the filling member 400, interlayer insulating film 14 and joint section 30 are etched until both of the first and second interconnects 12 and 22 are exposed. Here, etching is performed under the conditions that allow digging of the filling member 400, interlayer insulating film 14 and joint section 30 at the same etch rate. For example, etching is performed using $C_4F_8/Ar/O_2$ as an etching gas. After the etching, the hard mask 200a is removed as necessary.

This completes the fabrication of the connection hole 40 having the first and second interconnects 12 and 22 exposed at its bottom.

Figure 5H:
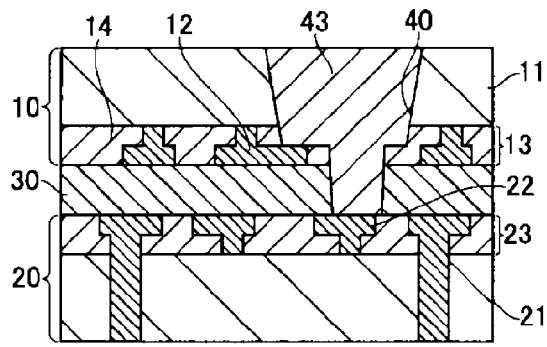

As illustrated in FIG. 5H, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the fourth embodiment is complete.

Advantageous Effect of the Manufacturing Method
of the Semiconductor Device According to the
Fourth Embodiment In the manufacturing method according to the fourth embodiment described above, the small-diameter concave portion 42-4 is provided in the filling member 400 without exposing the first and second interconnects 12 and 22 as illustrated in FIG. 5F. At this time, etching is performed so that the unetched thickness 'a' on top of the first interconnect 12 and the unetched thickness 'b' on top of the second interconnect 22 agree (i.e., a=b). In this condition, the filling member 400, interlayer insulating film 14 and joint section 30 are etched at the same etch rate. As a result, the etching is terminated when the second interconnect 22 is exposed simultaneously with the exposure of the first interconnect 12. This ensures that the exposed first interconnect 12 is not subjected to an etching atmosphere for an extended period of time, thus minimizing excessive etching of the first interconnect 12.

Therefore, the manufacturing method according to the fourth embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Further, filling the filling member 400 into the large-diameter concave portion 41-4 is a distinctive feature of the manufacturing method according to the fourth embodiment. This makes it possible to form a resist film on a planarized surface made up of the surface of the filling member 400 and that of the hard mask 200a during the formation of the small-diameter resist pattern 102 on the hard mask 200a as illustrated in FIG. 5D. The resist film free from level difference is patterned by lithography. This provides improved patterning accuracy in forming the small-diameter resist pattern 102 even for a small concave portion.

This contributes to further pitch reduction in the semiconductor device.

6. Fifth Embodiment

Manufacturing Method in which a Resist Material
Used to Cover the Second Interconnect is Left
Unremoved in the Small-Diameter Concave Portion
Formed Earlier A description will be given below of the manufacturing method of the semiconductor device 1 according to a fifth embodiment with reference to the cross-sectional process diagrams shown in FIGS. 6A to 6F. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween.

Figure 6A:
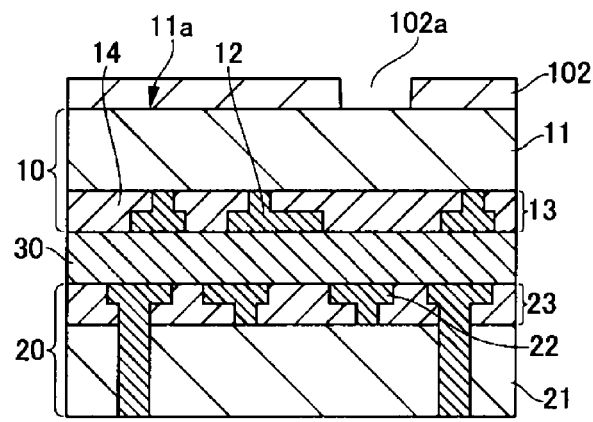
FIGS. 6A to 6F are cross-sectional process diagrams illustrating the manufacturing method of the semiconductor device according to a fifth embodiment.

Next, as illustrated in FIG. 6A, the small-diameter resist pattern 102 is formed on the front side 11a of the semiconductor layer 11 of the fabricated bonded substrate. The small-diameter resist pattern 102 has the opening 102a that exposes the top of the second interconnect 22.

Figure 6B:
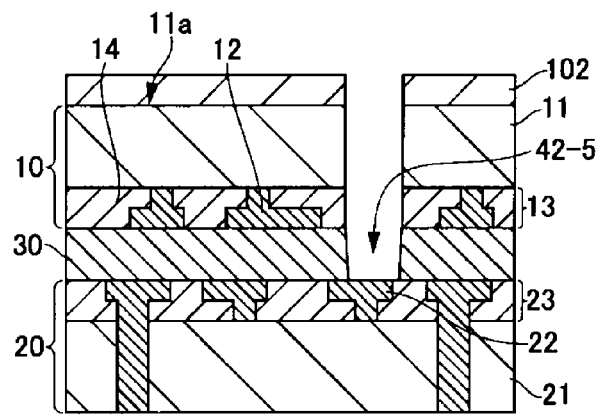

As illustrated in FIG. 6B, the pattern of a small-diameter concave portion 42-5 is formed on the bonded substrate by etching using the small-diameter resist pattern 102 as a mask. At this time, the semiconductor layer 11, interlayer insulating film 14 and joint section 30 are etched in this order using the small-diameter resist pattern 102 as a mask, and the etching is terminated when the second interconnect 22 is exposed. After the etching, the small-diameter resist pattern 102 is removed.

As a result of the above, the small-diameter concave portion 42-5 is formed which has the second interconnect 22 exposed at its bottom.

Figure 6C:
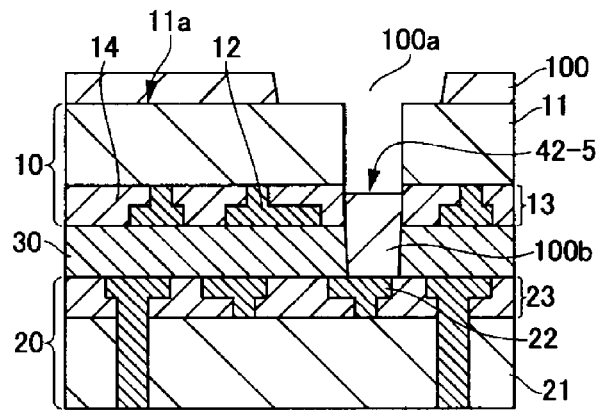

As illustrated in FIG. 6C, the large-diameter resist pattern 100 is formed on the front side 11a of the semiconductor layer 11. The large-diameter resist pattern 100 has the opening 100a that exposes the tops of the first and second interconnects 12 and 22 within the area including the opening of the small-diameter concave portion 42-5 that has been formed. During the formation of the large-diameter resist pattern 100, a resist material 100b is left unremoved that covers the second interconnect 22 exposed in the small-diameter concave portion 42-5.

Figure 6D:
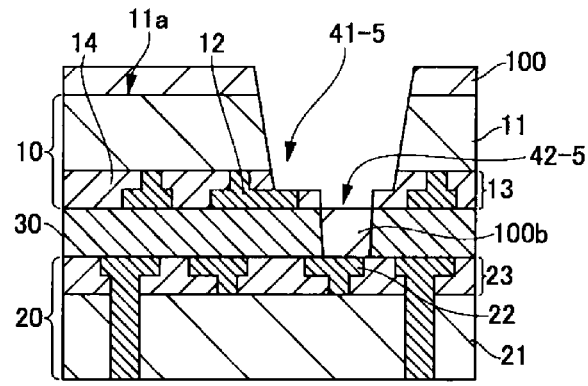

As illustrated in FIG. 6D, the pattern of a large-diameter concave portion 41-5 is formed on the bonded substrate by etching using the large-diameter resist pattern 100 as a mask. At this time, the semiconductor layer 11, interlayer insulating film 14 and joint section 30 are etched in this order using the large-diameter resist pattern 100 as a mask, and the etching is terminated when the first interconnect 12 is exposed. During this etching adapted to form the large-diameter concave portion 41-5, the resist material 100b left unremoved in the small-diameter concave portion 42-5 is etched and thinned. At the end of the etching, the resist material 100b may be completely removed. Alternatively, some thereof may be left unremoved.

As a result of the above, the large-diameter concave portion 41 is formed which has an opening sized to overlap the first and second interconnects 12 and 22, with the first interconnect 12 exposed in part of the bottom.

Figure 6E:
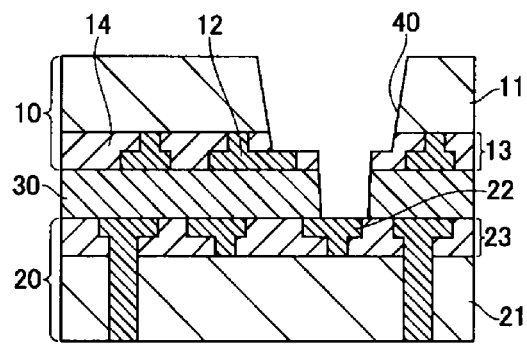

As illustrated in FIG. 6E, the resist pattern 100 (shown in FIG. 6D) is removed. At this time, the resist material 100b (shown in FIG. 6D) is removed at the same time if any is left. This completes the fabrication of the connection hole 40 having the first and second interconnects 12 and 22 exposed at its bottom.

Figure 6F:
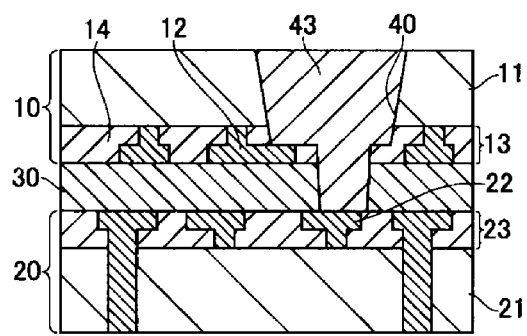

As illustrated in FIG. 6F, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the fifth embodiment is complete.

Advantageous Effect of the Manufacturing Method of the Semiconductor Device According to the Fifth Embodiment In the manufacturing method according to the fifth embodiment described above, the small-diameter concave portion 42-5 is formed first to expose the second interconnect 22, and then the large-diameter concave portion 41-5 is formed to expose the first interconnect 12, thus ensuring that the first interconnect 12 is not excessively etched.

Further, when the large-diameter resist pattern 100 is formed to form the pattern of the large-diameter concave portion 41-5, the second interconnect 22 exposed at the bottom of the small-diameter concave portion 42-5 is covered with the resist material 100b. With the second interconnect 22 covered as described above, etching is performed using the large-diameter resist pattern 100 as a mask until the first interconnect 12 is exposed. During this period of time, the resist material 100b covering the second interconnect 22 is etched and thinned. However, the resist material 100b is left unremoved all the way to the end of the etching or at least halfway through the etching, thus minimizing excessive etching of the second interconnect 22.

Therefore, the manufacturing method according to the fifth embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Further, in the manufacturing method according to the fifth embodiment, the etching from the front side 11a of the semiconductor layer 11 to the first interconnect 12 is performed in a single step without stopping halfway as illustrated in FIG. 6D, thus exposing the same interconnect 12. In contrast, in the manufacturing methods according to the second to fourth embodiments, etching is stopped halfway before the first interconnect 12 is reached, and etching is performed again to expose the same interconnect 12. That is, the etching from the front side 11a of the semiconductor layer 11 to the first interconnect 12 is performed in two steps, thus exposing the first interconnect 12. Therefore, the manufacturing method according to the fifth embodiment allows for manufacture of the semiconductor device 1 through a smaller number of steps than the manufacturing methods according to the second to fourth embodiments.

7. Sixth Embodiment

Manufacturing Method in which Etching is Stopped Halfway in Such a Manner that the Unetched Thicknesses on Top of the First and Second Interconnects Agree A description will be given below of the manufacturing method of the semiconductor device 1 according to a sixth embodiment with reference to the cross-sectional process diagrams shown in FIGS. 7A to 7F. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween.

Figure 7A:
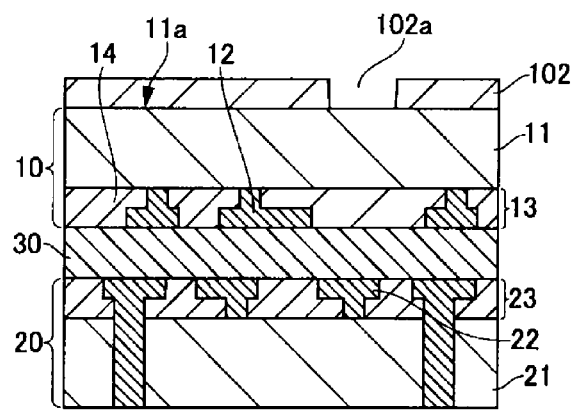
FIGS. 7A to 7F are cross-sectional process diagrams illustrating the manufacturing method of the semiconductor device according to a sixth embodiment.

Next, as illustrated in FIG. 7A, the small-diameter resist pattern 102 is formed on the front side 11a of the semiconductor layer 11 of the fabricated bonded substrate. The small-diameter resist pattern 102 has the opening 102a that exposes the top of the second interconnect 22.

Figure 7B:
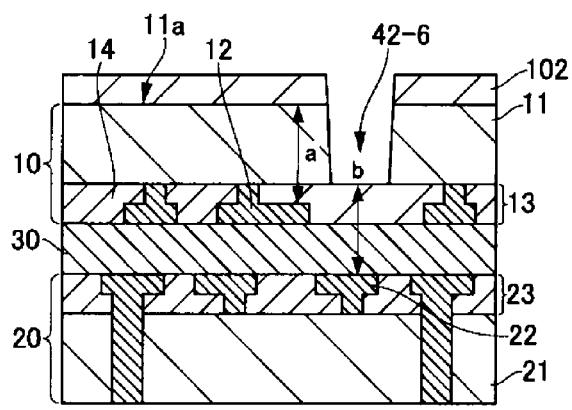

As illustrated in FIG. 7B, the pattern of a small-diameter concave portion 42-6 is formed in the bonded substrate by etching using the small-diameter resist pattern 102 as a mask. At this time, the semiconductor layer 11 and interlayer insulating film 14 are etched in this order using the small-diameter resist pattern 102 as a mask, and the etching is terminated before the second interconnect 22 is reached. Here, etching is performed until the unetched thickness 'a' on top of the first interconnect 12 and the unetched thickness 'b' on top of the second interconnect 22 agree (i.e., a=b). After the etching, the small-diameter resist pattern 102 is removed.

As a result of the above, the small-diameter concave portion 42-6 is formed in which the unetched thickness 'a' on top of the first interconnect 12 and the unetched thickness 'b' on top of the second interconnect 22 agree (i.e., a=b).

Figure 7C:
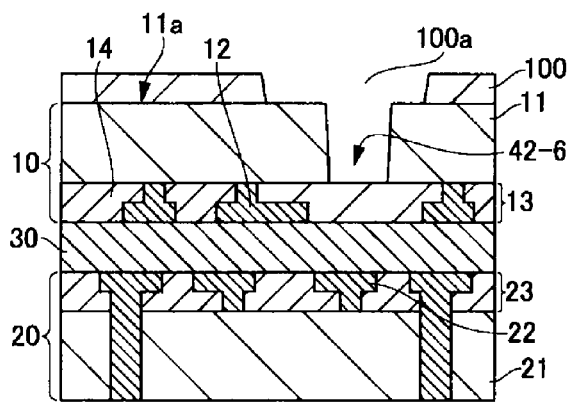

As illustrated in FIG. 7C, the large-diameter resist pattern 100 is formed anew on the front side 11a of the semiconductor layer 11. The large-diameter resist pattern 100 has the opening 100a that exposes the tops of the first and second interconnects 12 and 22 within the area including the small-diameter concave portion 42-6 that has been formed.

Figure 7D:
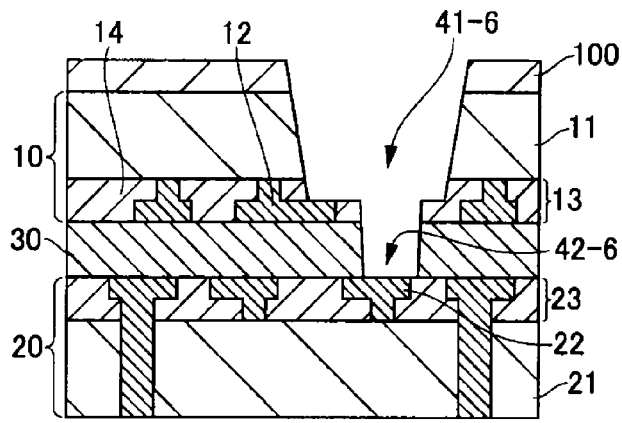

As illustrated in FIG. 7D, the pattern of a large-diameter concave portion 41-6 is formed in the bonded substrate, and the bottom of the small-diameter concave portion 42-6 is dug, by etching using the large-diameter resist pattern 100 as a mask. At this time, the semiconductor layer 11, interlayer insulating film 14 and joint section 30 are etched using the large-diameter resist pattern 100 as a mask until both of the first and second interconnects 12 and 22 are exposed. Here, etching is performed under the conditions that allow digging of the semiconductor layer 11, interlayer insulating film 14 and joint section 30 at the same etch rate.

As a result of the above, the large-diameter concave portion 41-6 is formed which has an opening sized to overlap the first and second interconnects 12 and 22, with the first interconnect 12 exposed in part of the bottom. At the same time, the second interconnect is exposed at the bottom of the small-diameter concave portion 42-6.

Figure 7E:
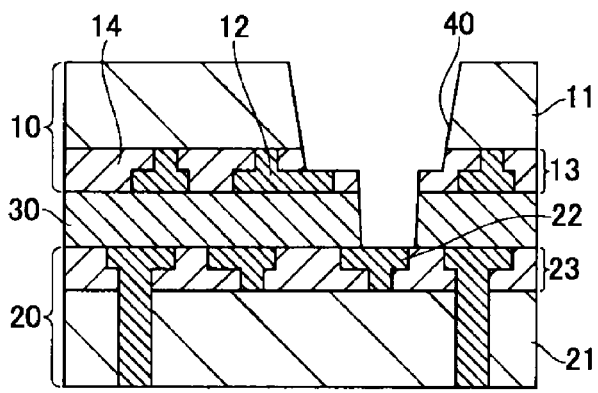

As illustrated in FIG. 7E, the resist pattern (100) is removed. This completes the fabrication of the connection hole 40 having the first and second interconnects 12 and 22 exposed at its bottom.

Figure 7F:
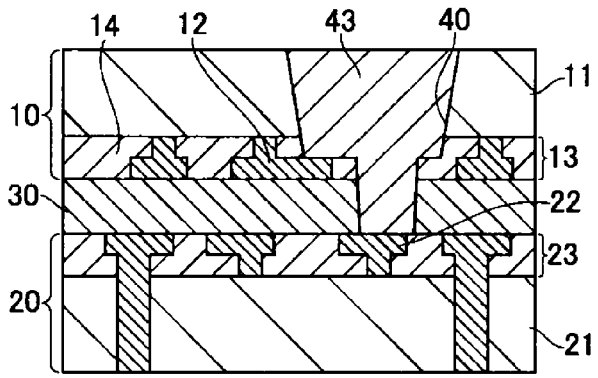

As illustrated in FIG. 7F, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the sixth embodiment is complete.

Advantageous Effect of the Manufacturing Method of the Semiconductor Device According to the Sixth Embodiment In the manufacturing method according to the sixth embodiment described above, the small-diameter concave portion 42-6 is formed without exposing the first and second interconnects 12 and 22 as illustrated in FIG. 7B. At this time, etching is performed so that the unetched thickness 'a' on top of the first interconnect 12 and the unetched thickness 'b' on top of the second interconnect 22 agree (i.e., a=b). As a result, the etching is terminated when the second interconnect 22 is exposed simultaneously with the exposure of the first interconnect 12. This ensures that the exposed first interconnect 12 is not subjected to an etching atmosphere for an extended period of time.

Therefore, the manufacturing method according to the sixth embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Further, in the manufacturing method according to the sixth embodiment, the etching from the front side 11a of the semiconductor layer 11 to the first interconnect 12 is performed in a single step without stopping halfway as illustrated in FIG. 7D, thus exposing the same interconnect 12. Therefore, the manufacturing method according to the sixth embodiment allows for manufacture of the semiconductor device 1 through a smaller number of steps than the manufacturing methods according to the second to fourth embodiments.

8. Seventh Embodiment

Manufacturing Method in which Etching is Stopped Halfway in Such a Manner that the Unetched Thicknesses on Top of the First and Second Interconnects Agree and in which a Hard Mask is Used A description will be given below of the manufacturing method of the semiconductor device 1 according to a seventh embodiment with reference to the cross-sectional process diagrams shown in FIGS. 8A to 8F. It should be noted that the final configuration of the semiconductor device 1 is the same as that of the semiconductor device 1 according to the first embodiment.

First, a bonded substrate is fabricated which has the first and second substrates 10 and 20 bonded together with the joint section 30 sandwiched therebetween.

Figure 8A:
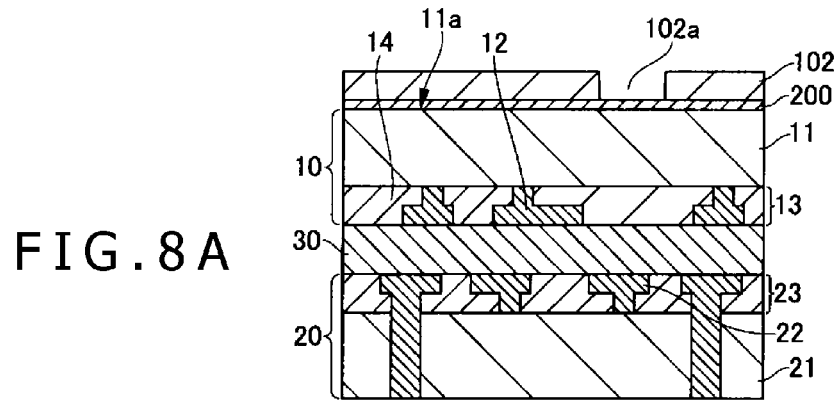
FIGS. 8A to 8F are cross-sectional process diagrams illustrating the manufacturing method of the semiconductor device according to a seventh embodiment.

Next, as illustrated in FIG. 8A, the hard mask layer 200 made, for example, of titanium nitride (TiN) is formed on the front side 11a of the semiconductor layer 11 of the fabricated bonded substrate. Next, the small-diameter resist pattern 102 is formed on the hard mask layer 200. The same pattern 102 has the opening 102a that exposes the top of the second interconnect 22.

Figure 8B:
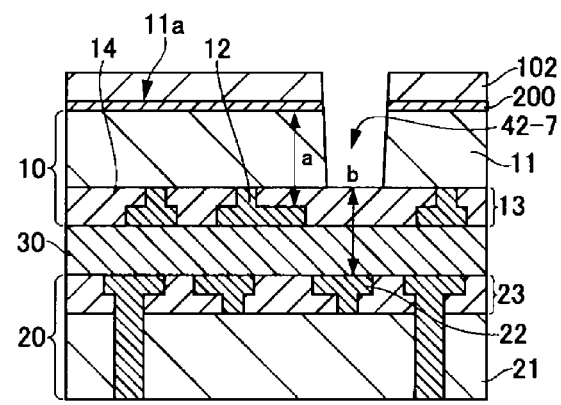

As illustrated in FIG. 8B, the pattern of a small-diameter concave portion 42-7 is formed on the bonded substrate by etching using the small-diameter resist pattern 102 as a mask. At this time, the hard mask layer 200, semiconductor layer 11 and interlayer insulating film 14 are etched in this order using the small-diameter resist pattern 102 as a mask, and the etching is terminated before the second interconnect 22 is reached. Here, etching is performed until the unetched thickness 'a' on top of the first interconnect 12 and the unetched thickness 'b' on top of the second interconnect 22 agree (i.e., a=b). After the etching, the small-diameter resist pattern 102 is removed.

As a result of the above, the small-diameter concave portion 42-7 is formed in which the unetched thickness 'a' on top of the first interconnect 12 and the unetched thickness 'b' on top of the second interconnect 22 agree (i.e., a=b).

Figure 8C:
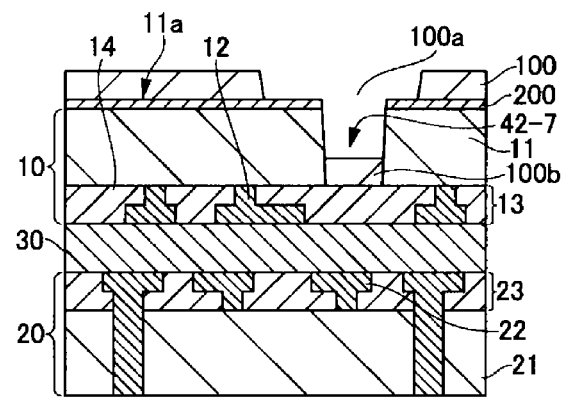

As illustrated in FIG. 8C, the large-diameter resist pattern 100 is formed anew on the hard mask layer 200. The large-diameter resist pattern 100 has the opening 100a that exposes the tops of the first and second interconnects 12 and 22 within the area including the small-diameter concave portion 42-6 that has been formed. Here, during the formation of the large-diameter resist pattern 100, the resist film with a large level difference is patterned by photolithography. Therefore, the resist material 100b may be left unremoved near the bottom in the small-diameter concave portion 42-7. Next, the hard mask layer 200 is etched using the large-diameter resist pattern 100 as a mask, thus forming the hard mask (200a).

Figure 8D:
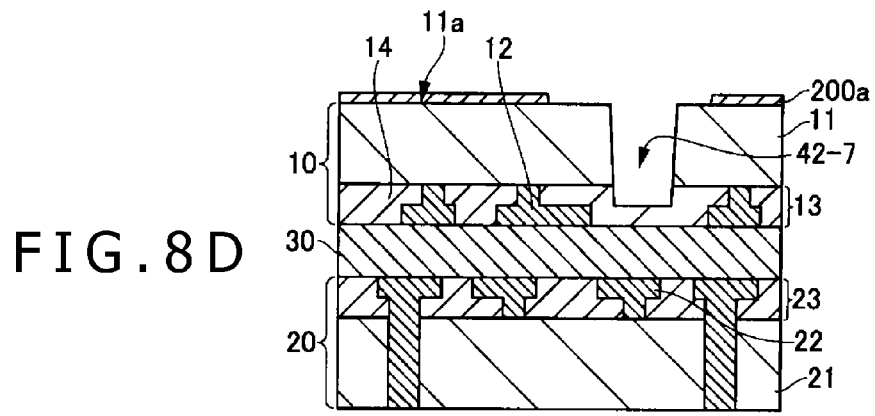

As illustrated in FIG. 8D, the resist pattern (100) is removed. At this time, the resist material (100b) left unremoved in the small-diameter concave portion 42-7 is removed at the same time. This exposes the hard mask 200a on the front side 11a of the semiconductor layer 11. The hard mask 200a has an opening that exposes the tops of the first and second interconnects 12 and 22.

Figure 8E:
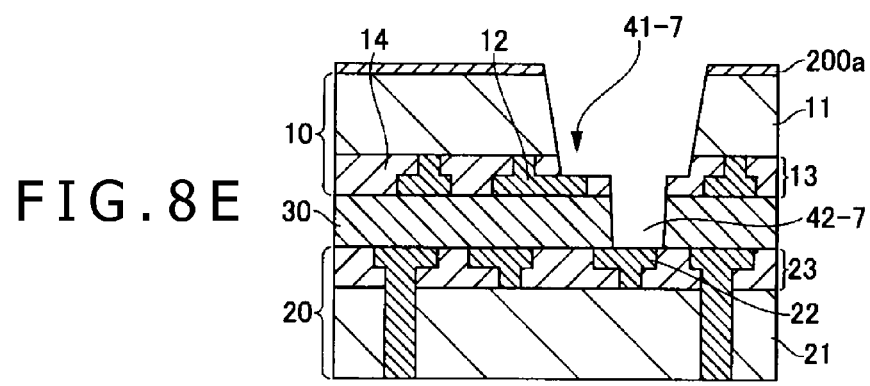

As illustrated in FIG. 8E, the pattern of a large-diameter concave portion 41-7 is formed on the bonded substrate, and the bottom of the small-diameter concave portion 42-7 is dug, by etching using the hard mask 200a as a mask. At this time, the semiconductor layer 11, interlayer insulating film 14 and joint section 30 are etched using the hard mask 200a as a mask until both of the first and second interconnects 12 and 22 are exposed. Here, etching is performed under the conditions that allow digging of the semiconductor layer 11, interlayer insulating film 14 and joint section 30 at the same etch rate. After the etching, the hard mask 200a is removed as necessary.

As a result of the above, the large-diameter concave portion 41-7 is formed which has an opening sized to overlap the first and second interconnects 12 and 22, with the first interconnect 12 exposed in part of the bottom, thus completing the fabrication of the connection hole 40.

Figure 8F:
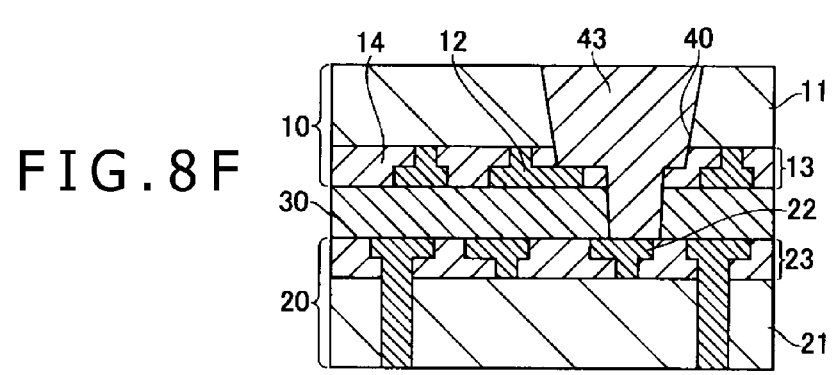

As illustrated in FIG. 8F, the filling metal 43 made, for example, of copper is filled into the connection hole 40 as a conductive member, thus connecting the first and second interconnects 12 and 22 located at different depths via the connection hole 40 having the filling metal 43 filled therein. It should be noted that although the filling metal 43 is used here as a conductive member, the conductive member is not limited thereto. Instead, a conductive film may be formed on the inner wall of the connection hole 40.

As a result of the above steps, the manufacture of the semiconductor device 1 according to the seventh embodiment is complete.

Advantageous Effect of the Manufacturing Method of the Semiconductor Device According to the Seventh Embodiment In the manufacturing method according to the seventh embodiment described above, the small-diameter concave portion 42-7 is formed without exposing the first and second interconnects 12 and 22 as illustrated in FIG. 8B. At this time, etching is performed so that the unetched thickness 'a' on top of the first interconnect 12 and the unetched thickness 'b' on top of the second interconnect 22 agree (i.e., a=b). As a result, the etching is terminated when the second interconnect 22 is exposed simultaneously with the exposure of the first interconnect 12. This ensures that the exposed first interconnect 12 is not subjected to an etching atmosphere for an extended period of time.

Therefore, the manufacturing method according to the seventh embodiment prevents accumulation of reaction products produced by excessive etching of the first interconnect 12 on the side wall of the connection hole 40 as does the manufacturing method according to the first embodiment. Further, the thinning of the first interconnect 12 due to excessive etching can be prevented, thus providing proper conductivity of the first interconnect 12 and proper connection between the first interconnect 12 and filling metal 43.

This contributes to improved yield of the semiconductor device 1.

Further, in the manufacturing method according to the seventh embodiment, etching is performed using the hard mask 200a rather than the large-diameter resist pattern 100 to form the pattern of the large-diameter concave portion 41-7 as illustrated in FIG. 8D. As a result, even if the resist material 100b is left unremoved that covers the second interconnect 22 in the small-diameter concave portion 42-7 formed earlier during the formation of the large-diameter resist pattern 100, etching adapted to form the pattern of the large-diameter concave portion 41-7 can be performed thereafter without a hitch as illustrated in FIG. 8C. That is, before the formation of the pattern of the large-diameter concave portion 41-7, the large-diameter resist pattern 100 is removed. At the same time, the resist material 100b left unremoved is removed. Then, the pattern of the large-diameter concave portion 41-7 is formed using the hard mask 200a. Therefore, it is not necessary to consider the lithography accuracy in relation to the underlying layer with a large level difference in forming the large-diameter resist pattern 100, thus making it easy to set the lithography conditions.

Further, in the manufacturing method according to the seventh embodiment, the etching from the front side 11a of the semiconductor layer 11 to the first interconnect 12 is performed in a single step without stopping halfway as illustrated in FIG. 8E, thus exposing the same interconnect 12. As with the manufacturing method according to the fifth embodiment, therefore, the manufacturing method according to the seventh embodiment allows for manufacture of the semiconductor device 1 through a smaller number of steps than the manufacturing methods according to the second to fourth embodiments.

It should be noted that, in the seventh embodiment, the hard mask 200a is formed by etching using the large-diameter resist pattern 100 as a mask after the formation of the small-diameter concave portion 42-7 as illustrated in FIG. 8C. However, the manufacturing method according to the seventh embodiment is not limited thereto. For example, the hard mask 200a may be formed before the small-diameter concave portion 42-7 is formed. At this time, the large-diameter resist pattern 100 is formed on the hard mask layer 200 first, followed by etching, thus forming the hard mask 200a. Then, the large-diameter resist pattern 100 is removed, followed by the formation of the new resist pattern 102, thus forming the small-diameter concave portion 42-7.

In the manufacturing methods according to the second to fourth and seventh embodiments, the following case has been described. That is, the unetched thickness 'a' on top of the first interconnect 12 and the unetched thickness 'b' on top of the second interconnect 22 are adjusted so that these thicknesses agree (i.e., a=b). In this condition, even if the films remaining on top of the first and second interconnects 12 and 22 by etching are made of different materials, etching is performed under the conditions that allow digging of these films at the same etch rate. The first and second interconnects 12 and 22 are exposed at the same time, then the etching is terminated.

However, the manufacturing methods according to the second to fourth and seventh embodiments are also applicable when the etch rates of the films remaining unremoved on top of the first and second interconnects 12 and 22 are different. In this case, it is only necessary to adjust two periods of time, i.e., time period 'A' indicating how long the film remaining on top of the first interconnect 12 is etched before the same interconnect 12 is exposed and time period 'B' indicating how long the film remaining on top of the second interconnect 22 is etched before the same interconnect 22 is exposed, by factoring in the difference in etch rate between the films so that the time periods 'A' and 'B' are equal. That is, it is only necessary to adjust the unetched thicknesses 'a' and 'b' so that the time periods 'A' and 'B' are equal. These steps also provide the same advantageous effect as in the manufacturing methods according to the second to fourth and seventh embodiments.

In each of the above embodiments, a description has been given of the configuration and manufacturing method of the semiconductor device having the connection hole 40 in which the single first interconnect 12 is exposed together with the interlayer insulating film 14 at the bottom of the large-diameter concave portion 41, with the single second interconnect 22 exposed at the bottom of the small-diameter concave portion 42. The same portion 42 is provided by digging into the bottom of the large-diameter concave portion 41.

However, the present technology is not limited in application only to these configurations. Instead, the present technology is applicable to a configuration in which the plurality of first interconnects 12 are exposed together with the interlayer insulating film 14 at the bottom of the large-diameter concave portion 41 or to a configuration in which the plurality of second interconnects 22 are exposed at the bottom of the small-diameter concave portion 42.

It is possible to manufacture the semiconductor device 1 having any of these configurations by the same manufacturing method, thus providing the same advantageous effect.

Further, the present technology is applicable to a configuration in which the large-diameter concave portion 41 has its bottoms formed at two different depths, with the first interconnect 12 exposed at each of the depths.

Even the semiconductor device having such a configuration can be manufactured by the same manufacturing method. The first interconnect 12 is exposed together with the interlayer insulating film 14 only at the deepest position of the bottom of the large-diameter concave portion 41, and the shallow bottom includes only the first interconnect 12. Even in such a case, the first interconnect 12 exposed on the shallow bottom of the large-diameter concave portion 41 is excessively etched in some degree. However, it is possible to prevent the same interconnect 12 from being affected by the etching adapted to expose the second interconnect 22 located at a deeper position, thus providing the same advantageous effect.

It should be noted that the present technology is also applicable to a configuration in which the small-diameter concave portion 42 has its bottoms formed at two different depths, with the second interconnect 22 exposed at each of the depths.

The semiconductor device having such a configuration can be manufactured by the same manufacturing method.

Further, in each of the above embodiments, a description has been given of the configuration and manufacturing method of the semiconductor device having the connection hole 40 in which the first interconnect 12 arranged on the first substrate 10 and the second interconnect 22 arranged on the second substrate 22 are exposed.

However, the present technology is not limited in application only to these configurations. Instead, the present technology is applicable to a configuration in which the first interconnect and the second interconnect arranged deeper than the first interconnect in a single semiconductor layer are exposed in a connection hole.

It is possible to manufacture the semiconductor device 1 having such a configuration by the same manufacturing method, thus providing the same advantageous effect.

While a case has been described in the above embodiments in which the first and second conductive layers are interconnects, the present technology is not limited in application only to such a configuration. Instead, for example, the first and second conductive layers may be diffusion layers formed in a semiconductor layer. Even in this case, the present technology provides the same advantageous effect.

It should be noted that the present technology may have the following configurations.

(1)

A semiconductor device including:

a substrate having a first conductive layer and a second conductive layer arranged deeper than the first conductive layer;

a large-diameter concave portion having, on a main side of a substrate, an opening sized to overlap the first and second conductive layers, with the first conductive layer exposed in part of the bottom of the large-diameter concave portion;

a small-diameter concave portion extended from the large-diameter concave portion and formed by digging into the bottom of the large-diameter concave portion, with the second conductive layer exposed at the bottom of the small-diameter concave portion; and a conductive member provided in a connection hole made up of the large- and small-diameter concave portions to connect the first and second conductive layers.

(2)

The semiconductor device of feature 1, in which the substrate is a bonded substrate having a substrate including the first conductive layer and a substrate including the second conductive layer bonded together.

(3)

A manufacturing method of a semiconductor device including:

forming, on a main side of a substrate having a first conductive layer and a second conductive layer arranged deeper than the first conductive layer, a large-diameter resist pattern having an opening that exposes the tops of the first and second conductive layers;

forming, in the substrate, a large-diameter concave portion having the first conductive layer exposed at the bottom based on etching using the large-diameter resist pattern as a mask;

forming, on the main side of the substrate, a small-diameter resist pattern having an opening that exposes the top of the second conductive layer within the area where the large-diameter concave portion is formed; and forming, in the substrate, a small-diameter concave portion having the second conductive layer exposed at the bottom based on etching using the small-diameter resist pattern as a mask.

(4)

The manufacturing method of the semiconductor device of feature 3, in which after the formation of the large-diameter concave portion, the small-diameter resist pattern is formed in such a manner as to cover the first conductive layer, and in which the small-diameter concave portion is formed by etching using the small-diameter resist pattern as a mask.

(5)

The manufacturing method of the semiconductor device of feature 3, in which the large-diameter resist pattern is formed above the substrate with a hard mask layer sandwiched therebetween, in which before the formation of the large-diameter concave portion, a hard mask is formed by patterning the hard mask layer through etching using the large-diameter resist pattern as a mask, and in which next, the small-diameter concave portion is formed by etching the substrate using the small-diameter resist pattern as a mask to a depth not exposing the second conductive layer, followed by removal of the small-diameter resist pattern and etching from above the hard mask so as to expose the second conductive layer, and at the same time, the large-diameter concave portion is formed with the first conductive layer exposed therein.

(6)

The manufacturing method of the semiconductor device of feature 5, in which an unetched thickness of the small-diameter concave portion on top of the second conductive layer agrees with an unetched thickness of the large-diameter concave portion on top of the first conductive layer during etching of the substrate using the small-diameter resist pattern as a mask.

(7)

The manufacturing method of the semiconductor device of feature 5 or 6, in which after the formation of the hard mask by patterning the hard mask layer through etching using the large-diameter resist pattern as a mask, the substrate is etched to a depth not exposing the first conductive layer.

(8)

The manufacturing method of the semiconductor device of any one of features 5 to 7, in which the substrate includes an interlayer insulating film and semiconductor layer on the first conductive layer, and in which after the formation of the hard mask by patterning the hard mask layer through etching using the large-diameter resist pattern as a mask, the semiconductor layer is etched using the interlayer insulating film as an etching stopper.

(9)

The manufacturing method of the semiconductor device of feature 3, in which the large-diameter resist pattern is formed above the substrate with a hard mask layer sandwiched therebetween, in which before the formation of the large-diameter concave portion, a hard mask is formed by patterning the hard mask layer through etching using the large-diameter resist pattern as a mask, followed further by the etching of the substrate to a depth not exposing the first conductive layer, in which the large-diameter resist pattern is removed, and a filling member is filled into the concave portion of the substrate for planarization followed by the formation of the small-diameter resist pattern, and in which the small-diameter concave portion is formed by etching the substrate using the small-diameter resist pattern as a mask to a depth not exposing the second conductive layer, followed by removal of the small-diameter resist pattern and etching from above the hard mask so as to expose the second conductive layer at the bottom of the small-diameter concave portion, and at the same time, the large-diameter concave portion is formed with the first conductive layer exposed therein.

(10)

The manufacturing method of the semiconductor device of feature 3, in which before the formation of the large-diameter resist pattern, the small-diameter concave portion is formed by etching using the small-diameter resist pattern as a mask, and in which a resist material is left unremoved in the small-diameter concave portion in such a manner as to cover the second conductive layer during the formation of the large-diameter resist pattern.

(11)

The manufacturing method of the semiconductor device of feature 3, in which before the formation of the large-diameter resist pattern, the substrate is etched using the small-diameter resist pattern as a mask to a depth not exposing the second conductive layer, and in which then, the large-diameter concave portion is formed by etching using the large-diameter resist pattern as a mask with the first conductive layer exposed therein, and at the same time, the small-diameter concave portion is formed with the second conductive layer exposed therein.

(12)

The manufacturing method of the semiconductor device of feature 11, in which the unetched thickness of the small-diameter concave portion on top of the second conductive layer agrees with the unetched thickness of the large-diameter concave portion on top of the first conductive layer during etching of the substrate using the small-diameter resist pattern as a mask.

(13)

The manufacturing method of the semiconductor device of feature 11 or 12, in which the substrate includes the interlayer insulating film and semiconductor layer on the first conductive layer, and in which the semiconductor layer is etched using the interlayer insulating film as an etching stopper during etching of the substrate using the small-diameter resist pattern as a mask.

(14)

The manufacturing method of the semiconductor device of any one of features 3 to 13, in which after the formation of the large- and small-diameter concave portions, the conductive member connected to the first and second conductive layers is formed in a connection hole made up of the large- and small-diameter concave portions.

It should be understood by those skilled in the art that various modifications, combinations, sub-combinations and alterations may occur depending on design requirements and other factors in so far as they are within the scope of the appended claims or the equivalents thereof.

What is claimed is:

1. A semiconductor device, comprising:

a substrate having a first conductive layer and a second conductive layer arranged deeper than the first conductive layer, wherein the substrate is a bonded substrate having a substrate including the first conductive layer and a substrate including the second conductive layer bonded together;

a large-diameter concave portion having, on a main side of a substrate, an opening sized to overlap the first and second conductive layers, with the first conductive layer exposed in at least part of the bottom of the large-diameter concave portion, wherein the bottom of the large-diameter concave portion is co-planar with the top of the first conductive layer;

a small-diameter concave portion extended from the large-diameter concave portion with the second conductive layer exposed at the bottom of the small-diameter concave portion;

a conductive member provided in a connection hole made up of the large and small-diameter concave portions to connect the first and second conductive layers; and an interlayer insulating film exposed to the conductive member, the bottom of the large-diameter concave portion, and the top of the small-diameter concave portion.

2. The semiconductor device of claim 1, wherein only a top surface of the first conductive layer is exposed at the bottom of the large-diameter concave portion, and wherein only a top surface of the second conductive layer is exposed at the bottom of the small-diameter concave portion.

3. A semiconductor device, comprising:

a substrate having a first conductive layer and a second conductive layer arranged deeper than the first conductive layer, wherein the first conductive layer includes a top surface and a bottom surface;

a large-diameter concave portion having, on a main side of a substrate, an opening sized to overlap the first and second conductive layers, with the first conductive layer exposed in at least part of the bottom of the large-diameter concave portion, wherein the bottom of the large-diameter concave portion is co-planar with the top of the first conductive layer;

a small-diameter concave portion extended from the large-diameter concave portion with the second conductive layer exposed at the bottom of the small-diameter concave portion;

a conductive member provided in a connection hole made up of the large and small-diameter concave portions to connect the first and second conductive layers; and an interlayer insulating film exposed to the conductive member, the bottom of the large-diameter concave portion, and the top of the small-diameter concave portion, wherein the interlayer insulating film includes a top surface and a bottom surface, and wherein the top surface of the interlayer insulating film is co-planar with the top surface of the first conductive layer.

4. A semiconductor device, comprising:

a substrate having a first conductive layer and a second conductive layer arranged deeper than the first conductive layer, wherein the first conductive layer includes a top surface and a bottom surface;

a large-diameter concave portion having, on a main side of a substrate, an opening sized to overlap the first and second conductive layers, with the first conductive layer exposed in at least part of the bottom of the large-diameter concave portion, wherein the bottom of the large-diameter concave portion is co-planar with the top of the first conductive layer;

a small-diameter concave portion extended from the large-diameter concave portion with the second conductive layer exposed at the bottom of the small-diameter concave portion;

a conductive member provided in a connection hole made up of the large and small-diameter concave portions to connect the first and second conductive layers; and an interlayer insulating film exposed to the conductive member, the bottom of the large-diameter concave portion, and the top of the small-diameter concave portion, wherein the interlayer insulating film includes a top surface and a bottom surface, and wherein the bottom surface of the interlayer insulating film is co-planar with the bottom surface of the first conductive layer.

* * * * *